(12) United States Patent
Huang et al.

(10) Patent No.: US 12,074,027 B2
(45) Date of Patent: Aug. 27, 2024

(54) UNDERLAYER OF MULTILAYER STRUCTURE AND METHODS OF USE THEREOF

(71) Applicant: Taiwan Semiconductor Manufacturing Co., Ltd., Hsinchu (TW)

(72) Inventors: Jing-Hong Huang, Hsinchu (TW); Wei-Han Lai, Hsinchu (TW); Ching-Yu Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 471 days.

(21) Appl. No.: 17/481,680

(22) Filed: Sep. 22, 2021

(65) Prior Publication Data
US 2022/0392764 A1    Dec. 8, 2022

Related U.S. Application Data

(60) Provisional application No. 63/194,742, filed on May 28, 2021.

(51) Int. Cl.
| H01L 21/027 | (2006.01) |
| H01L 21/3213 | (2006.01) |
| G03F 7/09 | (2006.01) |
| G03F 7/11 | (2006.01) |

(52) U.S. Cl.
CPC .... *H01L 21/0276* (2013.01); *H01L 21/32139* (2013.01); *G03F 7/091* (2013.01); *G03F 7/11* (2013.01)

(58) Field of Classification Search
None
See application file for complete search history.

(56) References Cited

U.S. PATENT DOCUMENTS

| 9,768,022 B2 | 9/2017 | Weng et al. |
| 10,083,832 B1 | 9/2018 | Liu et al. |
| 10,101,659 B2 | 10/2018 | Chen et al. |

(Continued)

FOREIGN PATENT DOCUMENTS

| CN | 114545733 A | * | 5/2022 | ............. G03F 7/004 |
| CN | 115298610 A | * | 11/2022 | ............. B82Y 40/00 |

(Continued)

OTHER PUBLICATIONS

Google Translation JP-2008287251-A, Downloaded Aril 10, 2024.*

*Primary Examiner* — Michael Lebentritt
(74) *Attorney, Agent, or Firm* — Seed IP Law Group LLP

(57) ABSTRACT

A method includes providing a layered structure on a substrate, the layered structure including a bottom layer formed over the substrate and a photoresist layer formed over the bottom layer, exposing the photoresist layer to a radiation source, developing the photoresist layer, patterning the bottom layer and removing portions of the substrate through openings in the patterned bottom layer. In some embodiments, a middle layer is provided between the bottom layer and the photoresist layer. The material of the bottom layer includes at least one cross-linking agent that has been functionalized to decrease its affinity to other materials in the bottom layer.

20 Claims, 17 Drawing Sheets

(56) References Cited

U.S. PATENT DOCUMENTS

| | | | | |
|---|---|---|---|---|
| 2014/0273506 A1* | 9/2014 | Liu | ................. | C09D 5/006 |
| | | | | 438/758 |
| 2020/0333710 A1* | 10/2020 | Zi | ................. | G03F 7/162 |
| 2021/0271166 A1* | 9/2021 | Zi | ................. | G03F 7/094 |
| 2021/0364922 A1* | 11/2021 | Chen | ................. | H01L 21/0274 |

FOREIGN PATENT DOCUMENTS

| | | | | |
|---|---|---|---|---|
| JP | 2008287251 A | * | 11/2008 | ............. G03F 7/004 |
| TW | 200916956 A | | 4/2009 | |
| TW | 202001997 A | | 1/2020 | |

\* cited by examiner

UNDERLAYER OF MULTILAYER STRUCTURE AND METHODS OF USE THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

In one exemplary aspect, photolithography is a process used in semiconductor micro-fabrication to selectively remove parts of a thin film or a substrate. The process uses light to transfer a pattern (e.g., a geometric pattern) from a photomask to a light-sensitive layer (e.g., a photoresist layer) on the substrate. The light causes a chemical change (e.g., increasing or decreasing solubility) in exposed regions of the light-sensitive layer. Baking processes may be performed before and/or after exposing the substrate, such as in a pre-exposure and/or a post-exposure baking process. A developing process then selectively removes the exposed or unexposed regions with a developer solution forming an exposure pattern in the substrate. Finally, a process is implemented to remove (or strip) the remaining photoresist from the underlying material layer(s), which may be subjected to addition circuit fabrication steps. For a complex IC device, a substrate may undergo multiple photolithographic patterning processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
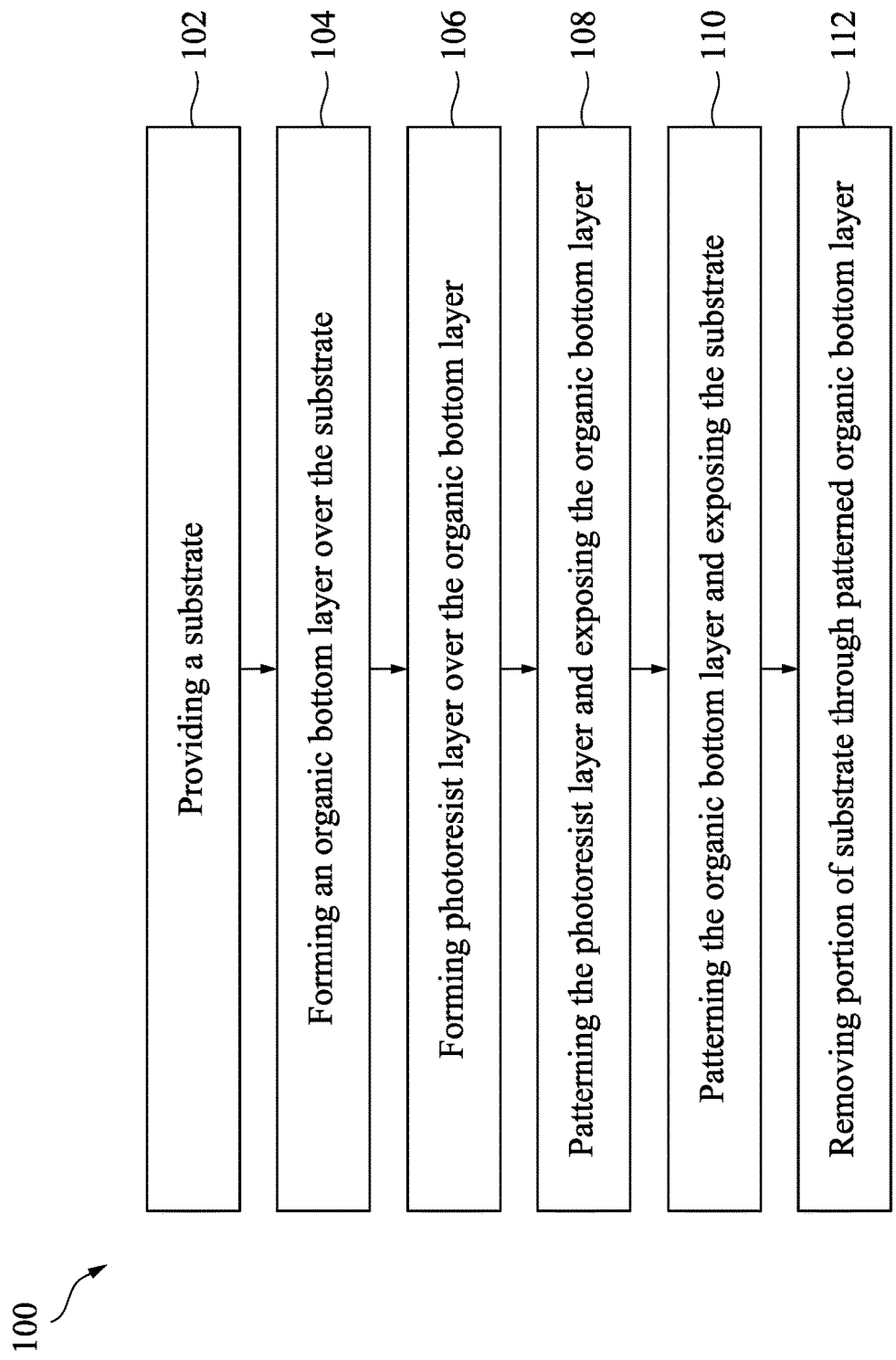
FIGS. 1A and 1B are flow charts of a method in accordance with embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as "about," "substantially," and the like, should be interpreted as one having ordinary skill in the art would in view of current technological norms. Generally, the term "substantially" indicates a tighter tolerance than the term "about." For example, a thickness of "about 100 units" will include a larger range of values, e.g., 70 units to 130 units (+/−30%), than a thickness of "substantially 100 units," which will include a smaller range of values, e.g., 95 units to 105 units (+/−5%). Again, such tolerances (+/−30%, +/−5%, and the like) may be process- and/or equipment-dependent, and should not be interpreted as more or less limiting than a person having ordinary skill in the art would recognize as normal for the technology under discussion, other than that "about" as a relative term is not as stringent as "substantially" when used in a similar context.

The present disclosure is generally related to semiconductor devices, and more particularly to field-effect transistors (FETs), such as planar FETs, three-dimensional fin-line FETs (FinFETs), or gate-all-around (GAA) devices. The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

The present disclosure relates generally to IC device manufacturing and, more particularly, to device patterning processes using a multi-layer (e.g., a bi or tri-layer) structure. The bi-layer structure may include a photoresist layer and a bottom layer (e.g., bottom anti-reflective coating, or BARC) on a metal layer or substrate. Such bottom layer may also be referred to as an underlayer herein. The tri-layer structure may include a photoresist layer, a middle layer (e.g., a hard mask layer), and a bottom layer (e.g., bottom anti-reflective coating, or BARC) formed on a metal layer or substrate. Such bi-layer and tri-layer structures have demonstrated advantages in minimizing substrate reflectivity of a light (e.g., radiation) source and increasing etching selectivity between the bottom layer and the hard mask layer. However, improvements in the bi-layer structure and tri-layer structure for advanced patterning processes are still desired. For example, it has been observed that materials used to etch layers underlying the bi-layer or tri-layer structures, e.g., metal and/or substrate layers, can penetrate into the bottom layer, e.g., through an upper surface of the bottom layer, causing the bottom layer to swell. Swelling of the bottom layer introduces stresses into the bottom layer and/or materials in contact with the bottom layer. Such stresses can result in delamination or deformation of the bottom layer and delamination or deformation of layers of material in contact with the bottom layer. Such unwanted delamination or deformation negatively impacts the reproducibility and/or critical dimensions of the features patterned using the bottom layer. In accordance with embodiments described herein, modifying the bottom layer in ways described herein serves to mitigate or remedy this unwanted swelling and the attendant adverse effects of such swelling, thus improving the quality of the bottom layer used during the lithography patterning process.

Embodiments in accordance with the present disclosure are applicable to semiconductor structures that include a layer of organic material, e.g., a layer of spin coated organic material, e.g., a backside antireflective coating (i.e., BARC) over an underlying layer, e.g., a layer or layers of conductive or semi-conductive material (e.g., metal materials) or non-conductive material (e.g., dielectric materials), the removal of which requires exposing the layer of organic material to chemicals that can cause swelling of the layer of organic material.

Figure 15:
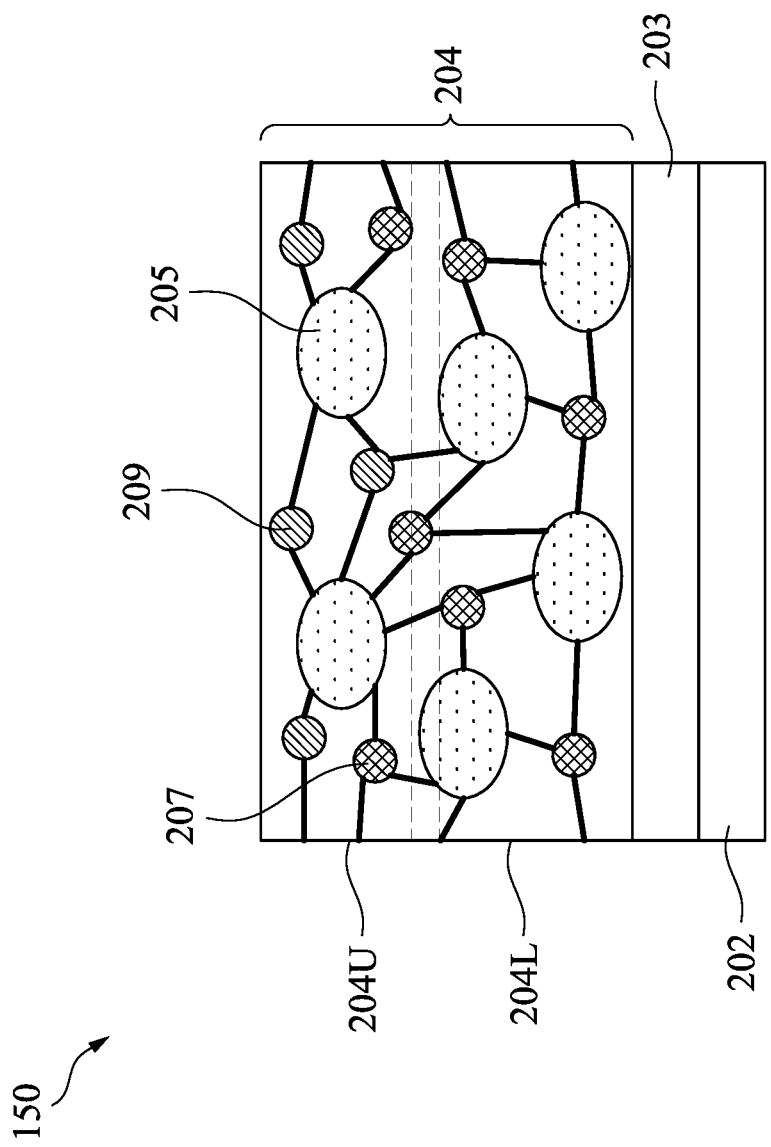
FIGS. 15 and 16 are views of various embodiments of an IC device at a specific stage of fabrication according to various aspects of the present disclosure.

Referring to FIG. 15, a structure 150, in accordance with embodiments of the present disclosure, includes a substrate 202, a conductive layer 203 over substrate 202 and a bottom layer 204 over conductive layer 203. In the follow description, substrate may be used to describe a substrate 202 as illustrated in FIG. 15 or a combination of substrate 202 and a conductive or semiconductive layer 203 on substrate 202. Bottom layer 204 may also be referred to as an underlayer herein. In accordance with embodiments of the present disclosure, bottom layer 204 includes a plurality of polymers 205, a plurality of first cross-linking agents 207 and a plurality of second cross-linking agents 209. As illustrated in FIG. 15, polymers 205 are cross-linked by first cross-linking agents 207 and by second cross-linking agents 209. In the embodiment illustrated in FIG. 15, bottom layer 204 includes an upper section 204U and a lower section 204L. In accordance with embodiments of the present disclosure, upper section 204U of bottom layer 204 includes a concentration of the second cross-linking agents 209 that is greater than the concentration of the second cross-linking agents 209 in lower section 204L. In accordance with other embodiments, upper section 204U includes a concentration of first cross-linking agents 207 and the second cross-linking agents 209 that is greater than the concentration of the first cross-linking agents 207 and second cross-linking agents 209 in the lower section 204L of bottom layer 204. As described below in more detail, this increased concentration of cross-linking agents in upper section 204U results in an increased concentration of cross-linking of the polymer 205 via the first and second cross-linking agent, thus rendering the upper section 204U of bottom layer 204 less susceptible to penetration by agents that are used to etch and remove portions of conductive layer 203 and/or substrate 202.

Figure 16:
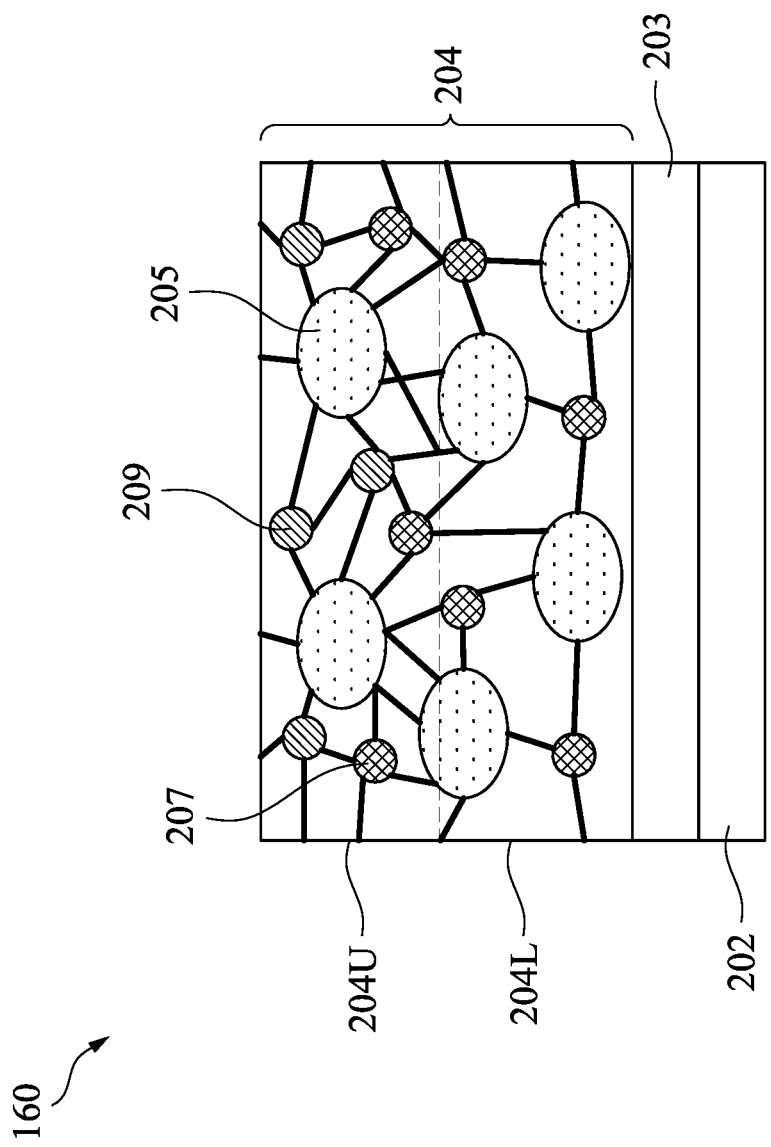

Referring to FIG. 16, a structure 160 in accordance with embodiments of the present disclosure is illustrated. Some of the features of structure 160 are similar to the features of structure 150 of FIG. 15. Those similar structures are identified in FIG. 16 using the same reference numbers used in FIG. 15. The description of those same structures provided above with respect to FIG. 15 is equally applicable to the same structures in FIG. 16 and is not reproduced. The structure 160 differs from the structure 150 of FIG. 15 in that in upper section 204U of bottom layer 204 in FIG. 16, direct cross-linking between different polymers 205 is present, cross-linking between individual first cross-linking agents 207 is present and cross-linking between individual second cross-linking agents 209 is present. This additional cross-linking in the structure of FIG. 16 renders upper section 204U of bottom layer 204 even more resistant to penetration by agents that are used to etch and remove portions of conductive layer 203 and/or substrate 202.

In the embodiment in which the bottom layer is a BARC layer, the bottom layer 204 comprises a polymer resin containing one or more of the polymers described below, a cross-linking agent and a modified cross-linking agent described below and optionally a catalyst. These elements of a BARC bottom layer 204, prior to dispersal, are placed within a BARC solvent, which allows for an easier dispersal. Once dispersed within the solvent, bottom layer 204, e.g., a BARC layer, may be baked and/or irradiated with electromagnetic radiate, e.g., light energy, as described below in more detail.

Polymers of the bottom layer 204 include novolac type polymers, polyhydroxystyrene polymers, such as poly(4-hydroxystyrene), novolac/hydroxystyrene copolymers and blends of novolac polymers and polyhydroxystyrene polymers. Novolac type polymers are phenol formaldehyde polymers (PF) or phenolic polymers that are synthetic polymers obtained by the reaction of phenol or substituted phenol with formaldehyde. Novolac polymers have the general structure, where n is one or more:

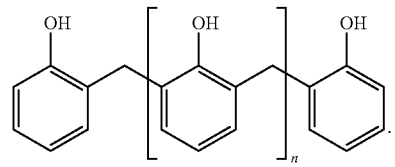

Poly(4-hydroxystyrene) polymers have the general formula, where n is one or more:

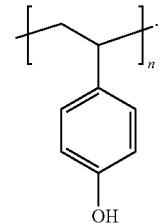

Molecular weight of these types of polymers when used as a BARC are greater than about 3000 and can be greater than about 10,000.

In an embodiment, the polymer of the bottom layer 204, e.g., the BARC, comprises a number of repeating monomer units, such as a surface energy modification monomer unit (with a surface energy modification group or moiety), an optional chromophore monomer unit and a cross-linking monomer unit. The surface energy modification moiety is used to match the surface energy of the bottom layer 204 to the surface energy of the material of the substrate. By matching the surface energies, when necessary, capillary forces may be used to enhance the gap filling performance of the bottom layer 204.

In one embodiment, the surface energy modification moiety may be used to increase the surface energy of the bottom layer 204. In such an embodiment, to raise the surface energy of the bottom layer 204, the surface energy modification monomer unit comprises a moiety that includes one or more of a hydroxyl group, a carboxyl group, an amine group, or an amide group. In a particular embodiment, the surface energy modification unit may have a structure such as the following:

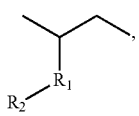

wherein the $R_1$ and $R_2$ groups collectively form a surface energy modification moiety and where $R_1$ is an alkyl group with hydrogen attached to the hydrocarbons and wherein $R_1$ may have a straight, branched, or cyclic structure. The alkyl group within $R_1$ may also comprise hetero atoms, such as containing nitrogen or oxygen atoms. $R_2$ may contain at least one of a hydroxyl, carboxyl, amine, or amide group.

In particular embodiments, the surface energy modification monomer unit may comprise an acrylic acid monomer, a methacrylic acid monomer, a hydrostyrene monomer, or a monomer derived from 2-hydroxyethyl acrylate, some of which have characteristics which allow them to act as the surface energy modification monomer, the chromophore monomer, and the cross-linking monomer. For example, in an embodiment in which the surface energy modification monomer unit is a hydrostyrene monomer, the surface energy modification monomer may have the following structure:

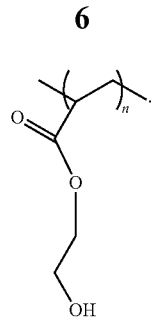

In an embodiment in which the surface energy modification monomer is an acrylic acid monomer, the surface energy modification monomer may have the following structure:

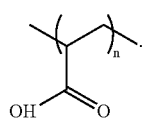

In an embodiment in which the surface energy modification monomer is a monomer derived from 2-hydroxyethyl acrylate, the surface energy modification monomer may have the following structure:

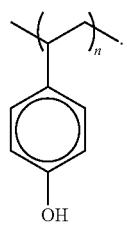

However, as one of ordinary skill in the art will recognize, the precise structures and examples described to raise the surface energy of the bottom layer 204 are intended to be illustrative and are not intended to be limiting. Rather, any suitable functional group within any suitable monomer that would raise the surface energy of the bottom layer 204 may alternatively be utilized. These are all fully intended to be included within the scope of the embodiments described herein.

Alternatively, the surface energy modification monomer may be used to decrease the surface energy of the bottom layer 204. In such an embodiment, to decrease the surface energy of the material of the bottom layer 204, the surface energy modification moiety within the surface energy modification monomer comprises one or more of an alkyl group, a fluoro group, or a benzyl group. In particular embodiments, the surface energy modification group moiety may comprise a linear, branched, or cyclic alkyl or fluoro functional group.

In a particular embodiment, the surface energy modification monomer may have a structure such as the following:

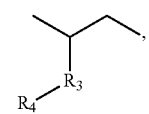

wherein the $R_3$ and $R_4$ groups collectively form the surface energy modification moiety and where $R_3$ is an alkyl group with hydrogen attached to the hydrocarbons and wherein $R_3$ may have a straight, branched, or cyclic structure. The alkyl group within $R_3$ may also comprise hetero atoms, such as containing nitrogen or oxygen atoms. However, in this embodiment, $R_4$ may contain at least one of an alkyl, fluoro, or benzyl group, and may comprise a linear, branched, or cyclic alkyl or fluoro group. For example, in some embodiments, the polymer with the surface energy modification monomer may have one of the following structures:

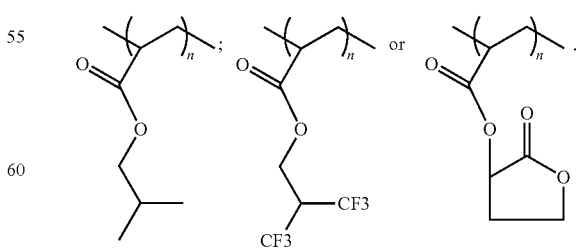

By utilizing the surface energy modification monomer, the surface energy of the polymer and, as such, the material of the bottom layer 204, may be modified such that it more closely resembles the surface energy of the substrate 202. By adjusting the surface energy, the bottom layer material, instead of being repelled by the underlying material, will be drawn into small openings between structures by capillary forces. This helps the bottom layer fill such gaps without voids. For example, in an embodiment, the surface energy of the polymer may be brought to within about 20 dyne/m² of the surface energy of the underlying material of the substrate 202.

In an embodiment, the chromophore monomer may comprise chromophore moieties such as vinyl compounds containing substituted and unsubstituted phenyl, substituted and unsubstituted anthracyl, substituted and unsubstituted phenanthryl, substituted and unsubstituted naphthyl, substituted and unsubstituted heterocyclic rings containing heteroatoms such as oxygen, nitrogen, sulfur, or combinations thereof, such as pyrrolidinyl, pyranyl, piperidinyl, acridinyl, quinolinyl. The substituents in these units may be any hydrocarbyl group and may further contain heteroatoms, such as, oxygen, nitrogen, sulfur, or combinations thereof, such as alkylenes, ester, ethers, combinations of these, or the like, with a number of carbon atoms between 1 and 12.

In specific embodiments, the chromophore moiety includes styrene, benzene groups, napthalene groups, anthracene groups, phenanthrene groups, hydroxystyrene, acetoxystyrene, vinyl benzoate, vinyl 4-tert-butylbenzoate, ethylene glycol phenyl ether acrylate, phenoxypropyl acrylate, N-methyl maleimide, 2-(4-benzoyl-3-hydroxyphenoxy)ethyl acrylate, 2-hydroxy-3-phenoxypropyl acrylate, phenyl methacrylate, benzyl methacrylate, 9-anthracenylmethyl methacrylate, 9-vinylanthracene, 2-vinylnaphthalene, N-vinylphthalimide, N-(3-hydroxy)phenyl methacrylamide, N-(3-hydroxy-4-hydroxycarbonylphenylazo)phenyl methacrylamide, N-(3-hydroxyl-4-ethoxycarbonylphenylazo) phenyl methacrylamide, N-(2,4-dinitrophenylamino phenyl) maleimide, 3-(4-acetoaminophenyl)azo-4-hydroxystyrene, 3-(4-ethoxycarbonylphenyl)azo-acetoacetoxy ethyl methacrylate, 3-(4-hydroxyphenyl)azo-acetoacetoxy ethyl methacrylate, tetrahydroammonium sulfate salt of 3-(4-sulfophenyl)azoacetoacetoxy ethyl methacrylate, combinations of these, or the like. However, any suitable monomer with chromophore moiety to absorb the impinging light and prevent the light from being reflected may alternatively be used, and all such monomers are fully intended to be included within the scope of the embodiments described herein.

In an embodiment in which the chromophore moiety comprise benzene, the chromophore groups 204 may have the following structure:

In an embodiment in which the chromophore moieties 204 comprise anthracene, the chromophore groups 204 may have the following structure:

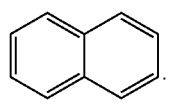

In an embodiment in which the chromophore moieties comprise phenanthrene, the chromophore moieties may have the following structure:

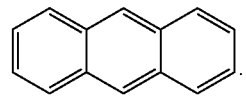

The cross-linking monomer may be used to crosslink the monomer with the polymers to modify the solubility of the bottom layer 204, and may optionally have an acid labile group. In some embodiments, the polymer of bottom layer 204 includes about 1-20 cross-linking moieties, and in other embodiments, the polymer of bottom layer 204 includes about 1-10 cross-linking moieties. In a particular embodiment, the cross-linking monomer may comprise a hydrocarbon chain that also comprises, e.g., a cross-linking moiety, such as a hydroxyl group, a carboxyl acid group, a carboxylic ester group, epoxy groups, urethane groups, amide groups, glycidyl ether groups, alkyl oxide groups, alkene groups, alkyne groups, triazene groups, combinations of these, and the like. Specific examples of cross-linking monomers that may be utilized include polyhydroxystyrene, poly (hydroxynaphthalene), poly(meth)acrylates, polyarylates, polyesters, polyurethanes, alkyd resins (aliphatic polyesters), poly(hydroxystyrene-methylmethacrylate), homopolymers and/or copolymers obtained by polymerization of at least one of the following monomers: styrene, hydroxystyrene, hydroxyethyl(meth)acrylate, hydroxypropyl(meth) acrylate, methyl (meth)acrylate, ethyl (meth)acrylate, (meth)acrylic acid, poly(hydroxystyrene-styrene-methacrylate), poly(hydroxystyrene-styrene-acrylate)poly(4-hydroxystyrene), and poly(pyromellitic dianhydride-ethylene glycol-propylene oxide).

In a particular embodiment, the cross-linking monomer may have the following structure:

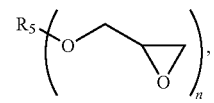

where $R_5$ comprises an alkyl group with hydrogen attached to the hydrocarbon structure, wherein the alkyl group may have a straight, branched, or cyclic structure. Additionally, the alkyl group may also comprise a hetero atom, such as comprising a nitrogen atom or an oxygen or fluorine atom, or even an alkyl fluoride.

In alternative embodiments, the cross-linking monomer may have one of the following structures:

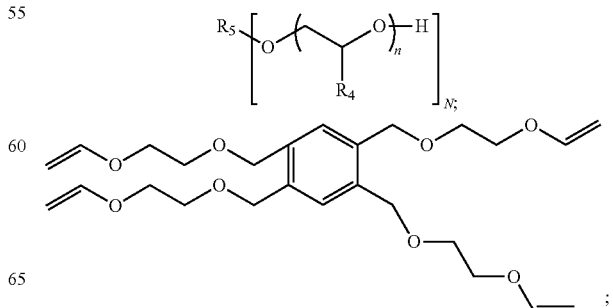

-continued

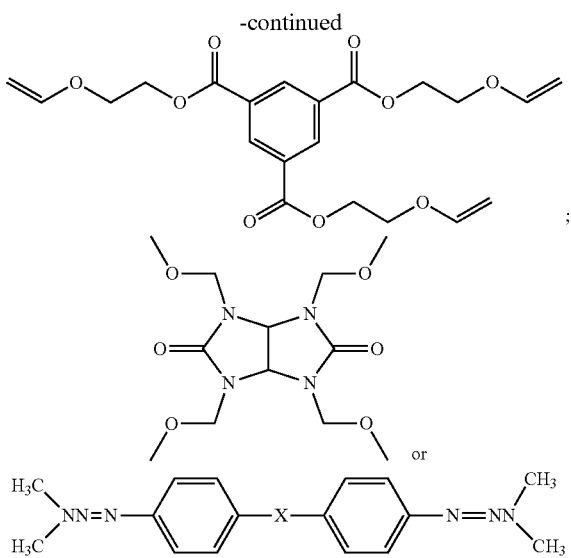

where $R_5$ is the same as above and wherein $R_6$ represents a hydrogen atom or an alkyl group having 1 to 10 carbon atoms, and where n represents an integer number from 2 to 6, and where X is an optional cross-linking unit or spacer, with between 2 and 8 carbons atoms, such as an alkane unit.

In some embodiments, the cross-linking monomer has a cross-linking moiety that crosslinks when exposed to thermal energy. Such types of cross-linking moieties that cross-link when exposed to thermal energy include functional groups selected from —OH, —OR, —ROH, —R(OH)$_2$, —NR$_2$, —NRH, —C≡CH, —C=CH, —COOH, —RCOOH, —SH and —RSH, where R is where R=—C$_n$H$_{2n}$, —O—C$_n$H$_{2n}$—; X=epoxy, —OR, —NH$_2$, —NR$_2$H, where R$_a$ is —C$_n$H$_{2n+1}$ and n=1-4. In some embodiments, the cross-linking monomer is a cross-linking moiety that cross-links when exposed to light energy, i.e., a cross-linking moiety that is photosensitive. Examples of cross-linking moieties that are photosensitive include dienes (—C=CH—CH=C), —C≡CH, —C=CH or —N=N=N. Additionally, as one of ordinary skill in the art will recognize, the above description for the various monomers that may be polymerized to form the polymer for the bottom layer 204 are intended to be illustrative and are not intended to limit the embodiments in any fashion. Rather, any suitable monomer or combination of monomers that perform the desired functions of the monomers described herein may also be utilized. All such monomers are fully intended to be included within the scope of the embodiments described herein.

In an embodiment, the surface energy modification monomer may have a loading within the polymer of between about 1% and about 100%, such as about 90%. Also, the chromophore monomer may have a loading within the polymer of between about 0% and about 100% (such as when the surface energy modification monomer can also act as the chromophore monomer), such as about 5%, and the cross-linking monomer may have a loading of between about 0% and about 100% (such as when the surface energy modification monomer can also act as the cross-linking monomer), such as about 5%. However, these descriptions are intended to be illustrative, as any suitable loading between the various monomers of the polymer may be used, and all such loadings are fully intended to be included within the scope of the embodiments described herein.

The catalyst may be a compound that is used to generate a chemically active species and initiate a cross-linking reaction between the polymers of the polymer resin and may be, e.g., a thermal acid generator, a photoacid generator, or a photobase generator, suitable combinations of these, or the like. In an embodiment in which the catalyst is a thermal acid generator, the catalyst will generate an acid when sufficient heat is applied to the bottom layer 204. Specific examples of the thermal acid generator include butane sulfonic acid, triflic acid, nonaflurobutane sulfonic acid, nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid, combinations of these, or the like.

In an embodiment in which the catalyst is a photoacid generator, the catalyst may comprise halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α-(trifluoromethylsulfonyloxy)-bicyclo[2.2.1]hept-5-ene-2,3-dicarboximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α'-bis-sulfonyl-diazomethanes, sulfonate esters of nitro-substituted benzyl alcohols, naphthoquinone-4-diazides, alkyl disulfones, and the like.

In other embodiments the catalyst may be a photobase generator. In such an embodiment, the photobase generator may comprise quaternary ammonium dithiocarbamates, aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like.

In specific embodiments the catalyst may utilize an amine, which will quench the acidity of, e.g., an acid functional group. As such, the acid will be generated by a removal of the amine, such as by evaporation of the amine during, e.g., a baking process. In this embodiment the catalyst may have one of the following structures:

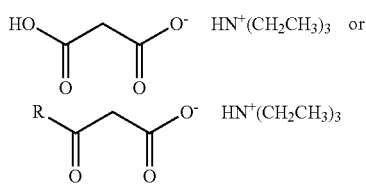

In addition to the polymer resin and optional catalyst described above, bottom layer 204 also includes a base cross-linking agent (207 in FIGS. 15 and 16) and a modified cross-linking agent (209 in FIGS. 15 and 16) described below. As described below in more detail, the base cross-linking agents react with the polymers 205 of the polymer resin of the bottom layer 204 to crosslink the polymers 205 of the polymer resin. Such cross-linking occurs in response to exposure of the polymers of the polymer resin and the cross-linking agent to sufficient thermal energy to promote cross-linking of the polymers of the polymer resins with the cross-linking agents described herein. This cross-linking assists in increasing the cross-linking density of the material of the bottom layer. Suitable cross-linking agents for cross-linking the polymers of the polymer resins in response to thermal energy include cross-linking moieties such as epoxy groups (ROR), ester (R—COOR) groups, ether (R—OR), tosylate groups (R-OT), —C=CH, —C≡C, SH, or anhydride where (R can be alkyl with 1 to 10 carbon atoms, benzyl, diene, allyl, phenyl or heterocyclic). In addition, cross-linking of the polymers of the polymer resin with cross-linking agents can be achieved by cross-linking the polymer of the polymer resin with photosensitive cross-linking agents that react with the polymer in response to exposure to light energy. Suitable photosensitive cross-linking agents may include one or more photosensitive cross-linking moieties such as —CH=CH2, —CH=CH—CH=CH2, acrylate (—CO—CH=CH2), cyclic alkylidene and the like. This cross-linking assists in increasing the cross-linking density of the material of the bottom layer. In addition, the photosensitive cross-linking agents may also crosslink with each other to further increase the density of the material of the bottom layer 204. In some embodiments, suitable cross-linking agents include moieties from each of the types of moieties described in the immediately preceding two sentences.

In an embodiment, the base cross-linking agent may be a melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, a polyether polyol, a polyglycidyl ether, a vinyl ether, a triazine, an alkene, and alkyne, combinations of these, or the like.

Specific examples of materials that may be utilized as a base cross-linking agent include melamine, acetoguanamine, benzoguanamine, urea, ethylene urea, or glycoluril with formaldehyde, glycoluril with a combination of formaldehyde and a lower alcohol, hexamethoxymethylmelamine, bismethoxymethylurea, bismethoxymethylbismethoxyethylene urea, tetramethoxymethylglycoluril, and tetrabutoxymethylglycoluril, mono-, di-, tri-, or tetra-hydroxymethylated glycoluril, mono-, di-, tri-, and/or tetra-methoxymethylated glycoluril, mono-, di-, tri-, and/or tetra-ethoxymethylated glycoluril, mono-, di-, tri-, and/or tetra-propoxymethylated glycoluril, and mono-, di-, tri-, and/or tetra-butoxymethylated glycoluril, 2,3-dihydroxy-5-hydroxymethylnorbornane, 2-hydroy-5,6-bis(hydroxymethyl) norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane, tetramethoxymethyl glycoluril, methylpropyltetramethoxymethyl glycoluril, and methylphenyltetramethoxymethylglycoluril, 2,6-bis(hydroxymethyl)p-cresol, N-methoxymethyl- or N-butoxymethyl-melamine. Additionally, compounds may be obtained by reacting formaldehyde, or formaldehyde and lower alcohols with amino group-containing compounds, such as melamine, acetoguanamine, benzoguanamine, urea, ethylene urea and glycoluril, and substituting the hydrogen atoms of the amino group with hydroxymethyl group or lower alkoxymethyl group, examples being hexamethoxymethylmelamine, bismethoxymethyl urea, bismethoxymethylbismethoxyethylene urea, tetramethoxymethyl glycoluril and tetrabutoxymethyl glycoluril, copolymers of 3-chloro-2-hydroxypropyl methacrylate and methacrylic acid, copolymers of 3-chloro-2-hydroxypropyl methacrylate and cyclohexyl methacrylate and methacrylic acid, copolymers of 3-chloro-2-hydroxypropyl methacrylate and benzyl methacrylate and methacrylic acid, bisphenol A-di(3-chloro-2-hydroxypropyl) ether, poly(3-chloro-2-hydroxypropyl)ether of a phenol novolac polymer, pentaerythritol tetra(3-chloro-2-hydroxypropyl)ether, trimethylolmethane tri(3-chloro-2-hydroxypropyl)ether phenol, bisphenol A-di(3-acetoxy-2-hydroxypropyl)ether, poly(3-acetoxy-2-hydroxypropyl)ether of a phenol novolac polymer, pentaerythritol tetra(3-acetoxy-2-hydroxypropyl)ether, pentaerythritol poly(3-chloroacetoxy-2-hydroxypropyl)ether, trimethylolmethane tri(3-acetoxy-2-hydroxypropyl)ether, combinations of these, or the like.

Other specific examples of materials that can be used as base cross-linking agents in accordance with embodiments of the present disclosure include acrylate polymers based on acrylate monomers functionalized by R—X (where R=—$C_nH_{2n}$, —O—$C_nH_{2n}$—; X=epoxy, —OR, —$NH_2$, —$NR_aH$ where $R_a$ is —$C_nH_{2n+1}$ and n=1-4; poly(4-hydroxystyrene) polymer based on 4-hydroxystyrene monomers functionalized by R—X (where R=—$C_nH_{2n}$, —O—$C_nH_{2n}$—; X=epoxy, —OR, —$NH_2$, —$NR_2H$ (where $R_a$ is —$C_nH_{2n+1}$ and n=1-4), novolac type polymers with 4-hydroxystyrene monomer functionalized by R—X (where R=—$C_nH_{2n}$, —O—$C_nH_{2n}$—, X=epoxy, —OR, —$NH_2$, —$NR_2H$ where $R_a$ is —$C_nH_{2n+1}$ and n=1-4); and copolymers or blends thereof.

In accordance with embodiments of the present disclosure, the material of the bottom layer 204, in addition to the base cross-linking agent (207 in FIGS. 15 and 16) further includes one or more modified cross-linking agent (209 in FIGS. 15 and 16) which has been modified to alter its affinity to or for other components in the bottom layer 204. Such modified cross-linking agents are to be distinguished from the cross-linking agents described above, which are referred to herein as the "base" cross-linking agents. The modified cross-linking agents may include these base cross-linking agents described above, modified as described below.

In accordance with embodiments of the present disclosure, the base cross-linking agents are modified by replacing certain functional groups of the base cross-linking agents with other functional groups which cause the modified cross-linking agent to have a lower attraction (hydrogen bonding attraction, van der Waals attraction, dipole attraction and the like) to/with other materials in the bottom layer 204 compared to the attraction the base cross-linking agent has for other materials, e.g., the polymer or base cross-linking agent, in the bottom layer 204. This reduced attraction allows the modified cross-linking agent to rise within the uncrosslinked bottom layer. For example, the modified cross-linking agent includes any of the base cross-linking agents described above which have been modified to replace one or more functional groups with functional groups that causes the modified cross-linking agent to have a lower attraction to other materials in the bottom layer as compared to the attraction to other materials exhibited by the base cross-linking agent. For example, functional groups of the base cross-linking agent can be replaced with a fluorine-containing functional group. Examples of fluorine-containing functional groups include functional groups which satisfy the following chemical formula, $-(CH_xF_y)_nCH_zF_m$ where n is 1 to 10, x+y=2 and z+m=3. For example, in accordance with embodiments of the present disclosure, the modified cross-linking agent includes the ratio of fluorine containing monomer units to other monomer units within the range of 10:1 to 1:10. When the ratio of fluorine containing monomer units to other monomer units is greater than about 10:1, the decrease in attraction of the modified crosslinking agent to other materials in the bottom layer may be greater than desired. When the ratio of fluorine containing monomer units to other monomer units is less than about 1:10, the decrease in attraction of the modified crosslinking agent to other materials in the bottom layer may not be as great as desired. The fluorine containing functional groups are examples of functional groups which cause the modified cross-linking agents to have a lower attraction to other materials in the bottom layer as compared to the attraction the base cross-linking agents have to other materials in the bottom layer. Other functional groups which exhibit a lower attraction for other materials in the bottom layer (compared to the functional groups of the base cross-linking agent) similar to the described fluorine containing functional groups are also within the scope of the present disclosure.

Specific examples of modified cross-linking agents useful in accordance with embodiments of the present disclosure include acrylate oligomers/polymers having a molecular weight of about 200 to 3000 with acrylate monomer units functionalized with $-(O-C_nF_{2n+1})$ where n=1~10, or partially functionalized with $-(O-C_nF_{2n+1})$ and one or more functional groups selected from epoxy, $-OR$, $-NH_2$, $-NRH$ (where R is $-C_nH_{2n+1}$ and n=1-4), where a ratio of $-(O-C_nF_{2n+1})$ to (epoxy, $-OR$, $-NH_2$, $-NRH$ (where R is $-C_nH_{2n+1}$ and n=1-4) is between about 0.1 to 10. Other examples of modified cross-linking agents useful in accordance with embodiments of the present disclosure include novolac type polymers, poly(4-hydroxystyrene) based polymers, or novolac/poly(4-hydroxystyrene) copolymers and blends of novolac type polymers and poly(4-hydroxystyrene) based polymers.

Additionally, as one of ordinary skill in the art will recognize, the precise examples listed above regarding the structures and groups of the compounds that may be used within the polymer resin, including the polymers, the cross-linking agents and the catalysts are illustrative and are not intended to list every possible structure or group that may be utilized. Any suitable alternative structures and any suitable alternative groups of the compounds that maybe used within the polymer resin, including the polymers, the cross-linking agents and the catalyst, and all such structures and groups are fully intended to be included within the scope of the embodiments described herein.

As discussed above, it has been observed that materials used to etch layers underlying bi-layer or tri-layer resist structures, e.g., metal and/or substrate layers, can penetrate into the bottom layer, causing the bottom layer to swell. Swelling of the bottom layer introduces stresses into the bottom layer or materials in contact with the bottom layer. Such stresses can result in delamination or deformation of the bottom layer and layers of material in contact with the bottom layer. Such unwanted delamination or deformation negatively impacts the reproducibility and/or critical dimensions of the features patterned using the bottom layer. In accordance with embodiments described herein, utilizing the modified cross-linking agents in accordance with embodiments of the present disclosure serves to mitigate or remedy this unwanted swelling and the attendant adverse effects of such swelling, thus improving the quality of the bottom layer used during the lithography patterning process.

Without intending to be bound by theory, it is believed that the provision of the modified cross-linking agent in accordance with embodiments of the present disclosure allows the modified cross-linking agent to rise within the spin coated bottom layer such that the concentration gradient of the modified cross-linking agent within the bottom layer increases from a lower section of the bottom layer to an upper section of the bottom layer. This increased concentration of the modified cross-linking agent near an upper surface of the bottom layer is believed to increase the density of the cross-linking at the upper surface of the bottom layer 204 which comes into contact with materials used to etch features underlying the bottom layer 204 or other materials used in semiconductor processing. Such increased density of cross-linking is believed to inhibit the penetration of such etchants or other materials used in semiconductor processing into the bottom layer 204, thereby reducing unwanted swelling of the bottom layer 204 when exposed to such etchants or other materials used in semiconductor processing.

FIG. 1A illustrates a flowchart of a method 100 for patterning a workpiece 200 according to some aspects of the present disclosure. The method 100 is merely an example, and is not intended to limit the present disclosure beyond what is explicitly recited in the claims. Additional operations can be provided before, during, and after the method 100, and some operations described can be replaced, eliminated, or completed in a sequence different from that illustrated in FIG. 1A. Intermediate steps of the method 100 are described with reference to cross-sectional views of the workpiece 200 as shown in FIGS. 2-7. For clarity and ease of explanation, some elements of the figures have been simplified.

Figure 2:
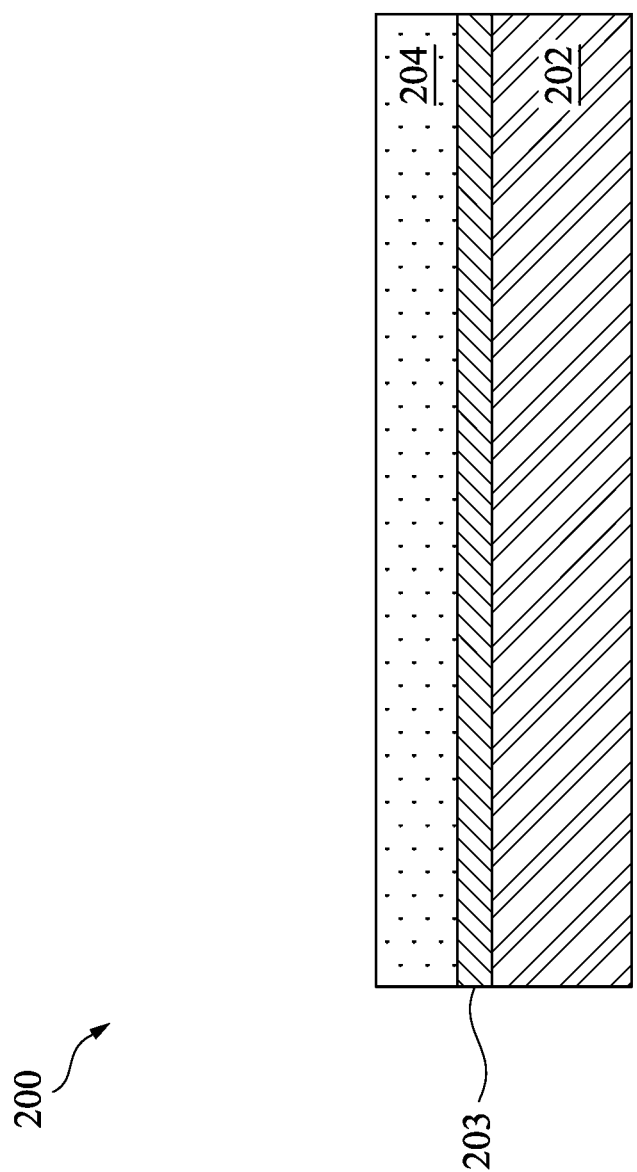
FIGS. 2-7 are views of various embodiments of an IC device at various stages of fabrication according to various aspects of the present disclosure.

Referring to block 102 of FIG. 1A and to FIG. 2, a workpiece 200 including a substrate 202 is provided (or received) for patterning. The substrate 202 may comprise an elementary (single element) semiconductor, such as silicon and/or germanium; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 202 may be a single-layer material having a uniform composition; alternatively, the substrate 202 may include multiple material layers having similar or different compositions suitable for IC device manufacturing. In one example, the substrate 202 may be a silicon-on-insulator (SOI) substrate having a semiconductor silicon layer formed on a silicon oxide layer. In other examples such as the one depicted in FIG. 2, the substrate 202 includes a conductive layer or feature 203, e.g., metal layer or feature 203, a semiconductor layer, a dielectric layer, other layers, and/or combinations thereof.

The substrate 202 may include various circuit features formed thereon including, for example, field effect transistors (FETs), metal-oxide semiconductor field effect transistors (MOSFETs), CMOS transistors, high voltage transistors, high frequency transistors, bipolar junction transistors, diodes, resistors, capacitors, inductors, varactors, other suitable devices, and/or combinations thereof.

In some embodiments where the substrate 202 includes FETs, various doped regions, such as source/drain regions, are formed on the substrate 202. The doped regions may be doped with p-type dopants, such as phosphorus or arsenic, and/or n-type dopants, such as boron or $BF_2$, depending on design requirements. The doped regions may be planar or non-planar (e.g., in a fin-like FET device) and may be formed directly on the substrate 202, in a P-well structure, in an N-well structure, in a dual-well structure, or using a raised structure. Doped regions may be formed by implantation of dopant atoms, in-situ doped epitaxial growth, and/or other suitable techniques.

Referring to block 104 of FIG. 1A and to FIG. 2, a bottom layer 204 (also referred to as an underlayer) is formed on the substrate 202, e.g., over the substrate 202 or over the conductive layer 203 when present in or on substrate 202. In many embodiments, the bottom layer 204 is a bottom anti-reflective coating (BARC) whose composition is chosen to minimize reflectivity of the light source implemented during exposure of a subsequently-formed photoresist layer (e.g., photoresist layer 214 in FIG. 3) formed over the bottom layer 204. The bottom layer 204 may be formed by spin-coating a BARC including the crosslinkers described above onto a top surface of the substrate 202 (or a top surface of the topmost material layer of a multi-layer substrate 202), baking or exposing the BARC to light, as described below in more detail.

As noted above, the substrate 202 may be a non-semiconductor material. For example, the substrate 202 may be a metal oxide, such as titanium oxide, hafnium oxide, yttrium oxide, lanthanum oxide, strontium titanium oxide, hafnium silicon oxide, hafnium silicon oxynitride, hafnium tantalum oxide, hafnium titanium oxide, hafnium aluminum oxynitride, hafnium zirconium oxide, titanium silicon nitride or aluminum oxide, or a metal nitride, such as titanium nitride, titanium silicon oxynitride, tantalum nitride tungsten nitride, molybdenum nitride, into which closely spaced features or openings are to be formed in accordance with embodiments described herein. These and all other suitable substrate materials may alternatively be utilized, and all such materials are fully intended to be included within the scope of the described embodiments. The bottom layer 204 is applied over the substrate 202 and may fill the regions between features of the substrate in preparation for an application of a photoresist layer 214 in FIG. 3. In an embodiment, the bottom layer 204 is a bottom anti-reflective coating layer which, as its name suggests, works to prevent the uncontrolled and undesired reflection of energy (e.g., light) back into the overlying photoresist layer 214 during an exposure of the photoresist layer 214, thereby preventing the reflecting light from causing reactions in an undesired region of the photoresist layer 214. Additionally, the bottom layer 204 may be used to provide a planar surface over the substrate 202 and features on or in the substrate 202, helping to reduce the negative effects of the energy impinging at an angle.

However, as one of ordinary skill in the art will recognize, a BARC as a bottom layer 204 is only one illustrative embodiment and is not intended to limit bottom layer 204 to a BARC. Rather, the material of the bottom layer 204 may be used in other capacities, such as for gap-fill, a material to lessen the impacts of a chemical mechanical polish process, an etching process, an implantation process, or even as a photoresist. The material of bottom layer 204 may be used for any suitable purpose and all such purposes are fully intended to be included within the scope of the embodiments.

In accordance with an embodiment of the present disclosure, the cross-linking of the polymer of bottom layer 204, e.g., a BARC polymer, with the cross-linking agents in bottom layer 204, is promoted by baking the bottom layer at a temperature between about 100° C. to 300° C. In some embodiments, baking of the bottom layer is carried out for 30 seconds to 240 seconds. Embodiments in accordance with the present disclosure are not limited to baking the bottom layer within the foregoing temperature range or within the foregoing time. For example, temperatures above or below the range described above can be utilized to cross-link the polymer with the cross-linking agents in bottom layer 204. In addition, baking of the bottom layer can be carried out for time periods above or below the range described above in order to cross-link the polymer with the cross-linking agents in bottom layer 204.

In accordance with another embodiment of the present disclosure, the cross-linking of the polymer of the bottom layer with the cross-linking agents in bottom layer 204 is promoted by a multistep baking process. An example of a multistep baking process includes baking the bottom layer in a first baking step at a temperature ranging between 100° C. to 180° C. for a period of time ranging between about 30 seconds to 180 seconds and then baking the bottom layer in a second baking step at a temperature ranging between 180° C. to 300° C. for a time period of 30 seconds to 180 seconds. Embodiments in accordance with the present disclosure are not limited to a multistep baking process as described above. For example, the temperature and time period of the first baking step may fall outside those described above. Further, the temperature and time period of the second baking step may fall outside the ranges described above.

In accordance with an embodiment of the present disclosure where a thermal baking is employed to promote the cross-linking of the polymer of bottom layer 204 and the cross-linking agents of the bottom layer 204, the weight ratio of the polymer of the bottom layer 204 and the combined amount of base cross-linking agent 207 and modified cross-linking agents 209 ranges between 4:1 to 1:4. When the weight ratio of the polymer of the bottom layer 204 and the combined amount of base cross-linking agent 207 and modified cross-linking agents 209 ranges is greater than about 4:1 an excess of crosslinking of the polymer of the bottom layer may occur. When the weight ratio of the polymer of the bottom layer 204 and the combined amount of base cross-linking agent 207 and modified cross-linking agents 209 ranges is less than about 1:4, insufficient cross-linking of the polymer of the bottom layer may occur. In some embodiments, the modified cross-linking agents 209 account for about 1 to 80 weight % of the combined amount of the base cross-linking agent 207 and the modified cross-linking agents 209 in bottom layer 204.

In accordance with other embodiments of the present disclosure, cross-linking of the polymer of the base layer 204 with the base cross-linking agent 207 and the modified cross-linking agent 209, and cross-linking between the polymers of the base layer 204 and cross-linking between the individual cross-linking agents 207 and 209 is promoted by exposing the bottom layer 204 to electromagnetic energy, e.g., light. An example of light useful to promote such cross-linking includes light having a wavelength in the range of 10 to 1000 nm. The exposure to light is carried out for a period of time sufficient to achieve the desired level of cross-linking. For example, the light exposure can be carried out for a period of time ranging from about 1 to 600 seconds when the light source has an intensity ranging between 1 to 500 milli joules. The light used for such exposure may be light of a single wavelength, light having several wavelengths or a broadband light. In accordance with these embodiments, the weight ratio of the polymer of the bottom layer 204 and the combined amount of base cross-linking agent 207 and modified cross-linking agents 209 ranges between 4:1 to 1:4. In some embodiments, the modified cross-linking agents 209 account for about 1 to 80 weight % of the combined amount of the base cross-linking agent 207 and the modified cross-linking agents 209. In addition, in accordance with embodiments of the present disclosure that utilize light energy to promote cross-linking between the base cross-linking agents 207, the modified cross-linking agents 209 and the polymer 205 of bottom layer, the ratio of thermally activated base cross-linking agents 207 to the light activated (photosensitive) base cross-linking agents 207 ranges between about 9:1 to 2:1. In accordance with some embodiments of the present disclosure, that utilize light energy to promote cross-linking between the base cross-linking agents 207, the modified cross-linking agents 209 and the polymer 205 of bottom layer, the ratio of thermal activated modified cross-linking agents 209 and light activated (photosensitive) modified cross-linking agents 209 ranges between about 9:1 to 2:1. When the ratio of thermal activated modified cross-linking agents 209 and light activated (photosensitive) modified cross-linking agents 209 is greater than about 9:1 the amount of crosslinking between the polymers of the base layer 204 and cross-linking between the individual cross-linking agents 207 and 209 maybe less than desired. When the ratio of thermal activated modified cross-linking agents 209 and light activated (photosensitive) modified cross-linking agents 209 is less than about 2:1 the amount of crosslinking between the polymers of the base layer 204 and cross-linking between the individual cross-linking agents 207 and 209 maybe greater than desired. Embodiments in accordance with the present disclosure are not limited to the foregoing ratios of thermally activated cross-linking agents and light activated cross-linking agents. For example, in some embodiments, the ratio of thermally activated cross-linking agents to light activated cross-linking agents in the bottom layer may fall outside the above described ranges.

When light energy is utilized to promote cross-linking between the base cross-linking agents 207, the modified cross-linking agents 209 and the polymer 205 of bottom layer, the light exposure can be accomplished utilizing multiple light exposure steps. For example, in an embodiment, a first light exposure occurs after the formation of bottom layer 204 and before formation of the photoresist layer 214 or the hard mask layer 206 and a second light exposure occurs after patterning of the bottom layer 204 prior to etching of the metal layer 203 or substrate 202. Embodiments in accordance with the present disclosure are not limited to such multistep light exposure processes. For example, some embodiments in accordance with the present disclosure utilize only one of the light exposure steps described above. When a multiple steps of light exposure are utilized, the wavelength of light utilized for each step may be the same or they may differ. In addition, the length of time of each of the individual exposure steps can be the same or they may be different. For example, when a two-step exposure process is utilized, the light exposure of the first light exposure step and the light exposure of the second step may be carried out for a period of time of about 1 to about 600 seconds when the light source has an intensity between about 1 to 500 mJ.

Figure 3:
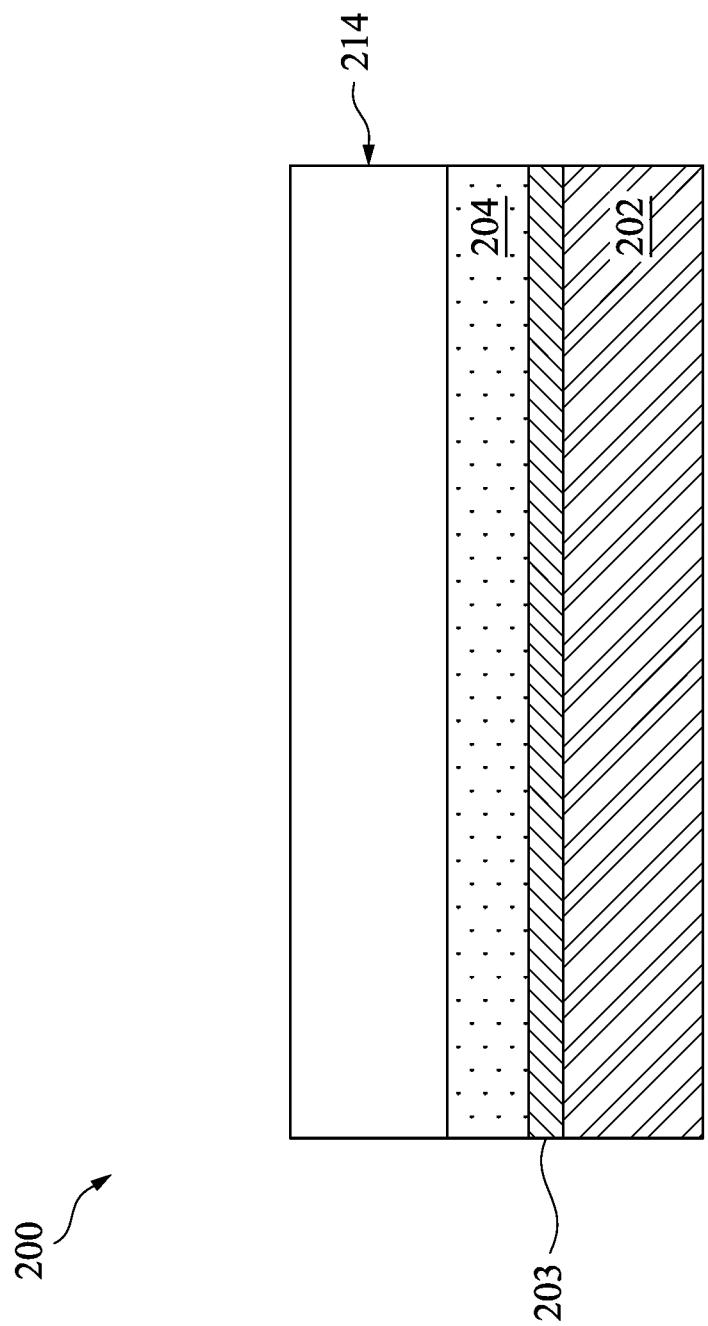

Referring to block 106 in FIG. 1A and to FIG. 3 a photoresist layer 214 is formed over the bottom layer 204. The photoresist layer 214 may include any lithographically sensitive resist material, and in many embodiments, the photoresist layer 214 includes a photoresist material sensitive to a radiation source (e.g., UV light, deep ultraviolet (DUV) radiation, and/or EUV radiation. However, the principles of the present disclosure apply equally to e-beam resists and other direct-write resist materials. The photoresist layer 214 may be a positive-tone or negative-tone resist material and may have a multi-layer structure. Furthermore, the photoresist layer 214 may be implemented with a chemical amplification (CA) resist material. In one embodiment, a positive-tone CA resist material includes a polymeric material (not depicted) that becomes soluble in a developer after the polymer is exposed to acidic moieties. Alternatively, a negative-tone CA resist material includes a polymeric material (not depicted) that becomes insoluble in a developer after the polymer is exposed to acidic moieties.

Figure 4:
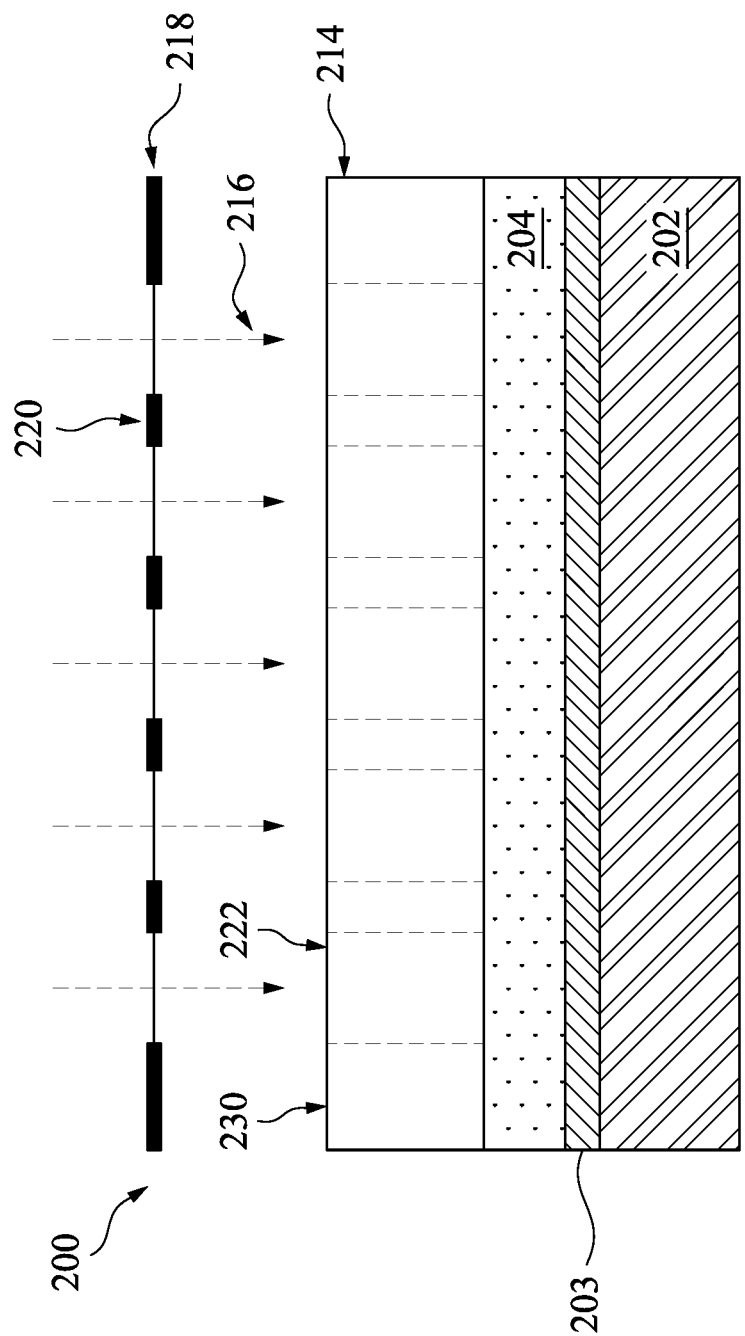

Referring to block 108 of FIG. 1A and to FIG. 4, the photoresist layer 214 is exposed to a radiation source generating radiation 216. In some embodiments, the radiation source producing radiation having a wavelength of approximately 365 nm, a DUV radiation such as KrF excimer laser (wavelength approximately 248 nm) or ArF excimer laser (wavelength approximately 193 nm), a EUV radiation (wavelength between about 1 nm and about 100 nm), an x-ray, an e-beam, an ion beam, and/or other suitable radiations. The exposure process at block 108 may be performed in air, in a liquid (immersion lithography), or in vacuum (e.g., for EUV lithography and e-beam lithography). In an exemplary embodiment, the exposure process at block 108 implements a photolithography technique using a photomask 220 that includes a pattern 218. The photomask 220 may be a transmissive mask or a reflective mask, the latter of which may further implement resolution enhancement techniques such as phase-shifting, off-axis illumination (OAI) and/or optical proximity correction (OPC). The photomask causes portions 222 of the photoresist layer 214 to be exposed to the radiation 216 and some portions 230 to not be exposed to the radiation 216. As depicted in FIG. 4, the exposed regions 222 of the photoresist layer 214 undergo chemical changes while unexposed regions 230 remain substantially unchanged in chemical properties. These chemical changes affect the solubility in a developer solution as described below.

Figure 5:
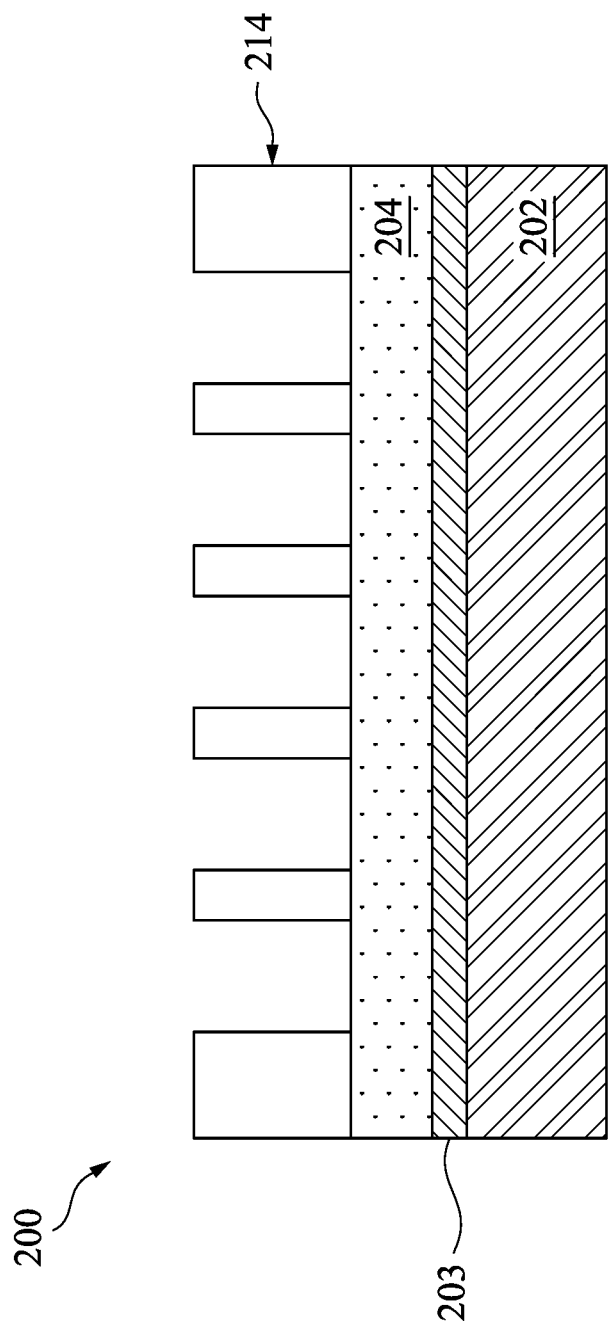

Referring to block 108 of FIG. 1A and to FIGS. 4 and 5, a developing process is performed on the workpiece 200. The developing process at block 108 dissolves or otherwise removes either the exposed regions 222 in the case of a positive-tone resist development process or the unexposed regions 230 in the case of a negative-tone resist development process. The developing process at block 108 may begin with a post-exposure baking process. Following the optional post-exposure baking process, a developer is applied to the workpiece 200, thereby removing the particular regions (the exposed regions 222 or the unexposed regions 230) of the photoresist layer 214. Suitable positive-tone developers include tetramethyl ammonium hydroxide (TMAH), KOH, NaOH, and/or other suitable solvents, and suitable negative-tone developers include solvents such as n-butyl acetate, ethanol, hexane, benzene, toluene, and/or other suitable solvents. In the depicted embodiment, the developer is a positive-tone, basic solvent such as TMAH. In many embodiments, a post-exposure bake is performed on the workpiece 200 subsequent to the developing process at block 108 to further stabilize the pattern of the photoresist layer 214.

Figure 6:
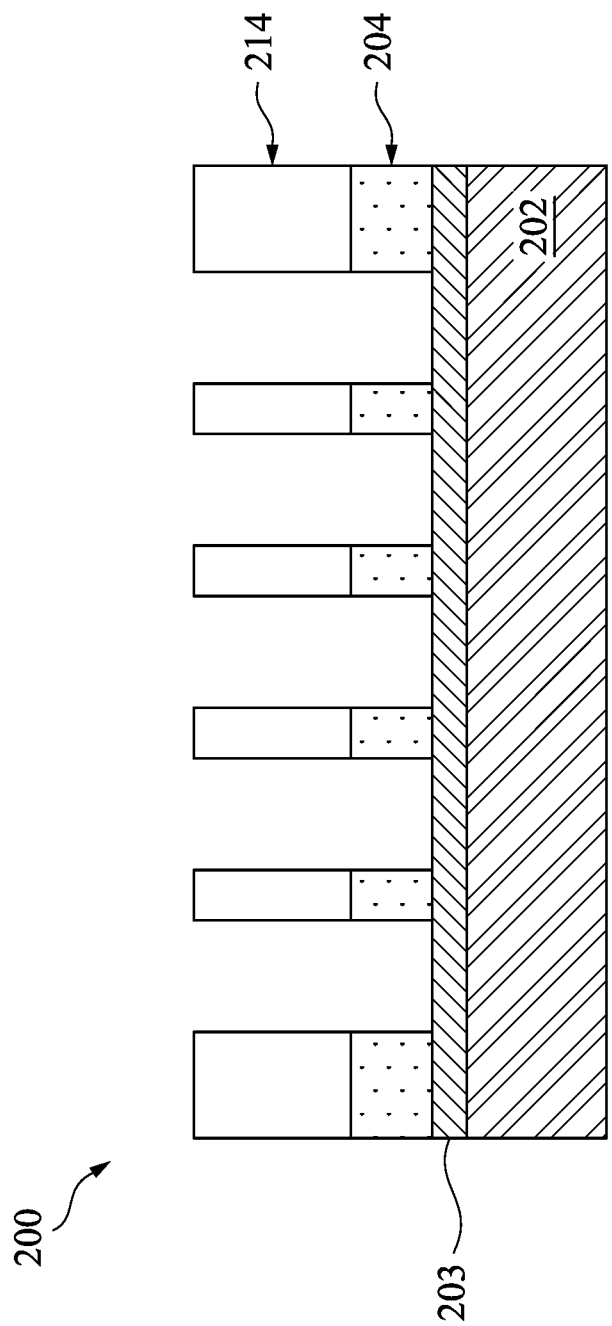

Referring to block 110 of FIG. 1A and to FIG. 6, portions of the bottom layer 204 (e.g., the BARC layer) are selectively removed in an etching process at block 110 using the patterned photoresist layer 214 as an etch mask. The etching/patterning process at block 110 demonstrates etching selectivity for the bottom layer 204 over the underlying substrate 202 and/or the conductive layer 203 on the substrate. In an embodiment illustrated in FIG. 7, the patterned photoresist layer 214 is removed from the workpiece 200 by any suitable method prior to etching of the substrate 202 or conductive layer 203 on substrate 202. In other embodiments, the patterned photoresist layer 214 is not removed before etching of the substrate 202 or conductive layer 203 on substrate 202.

Figure 7:
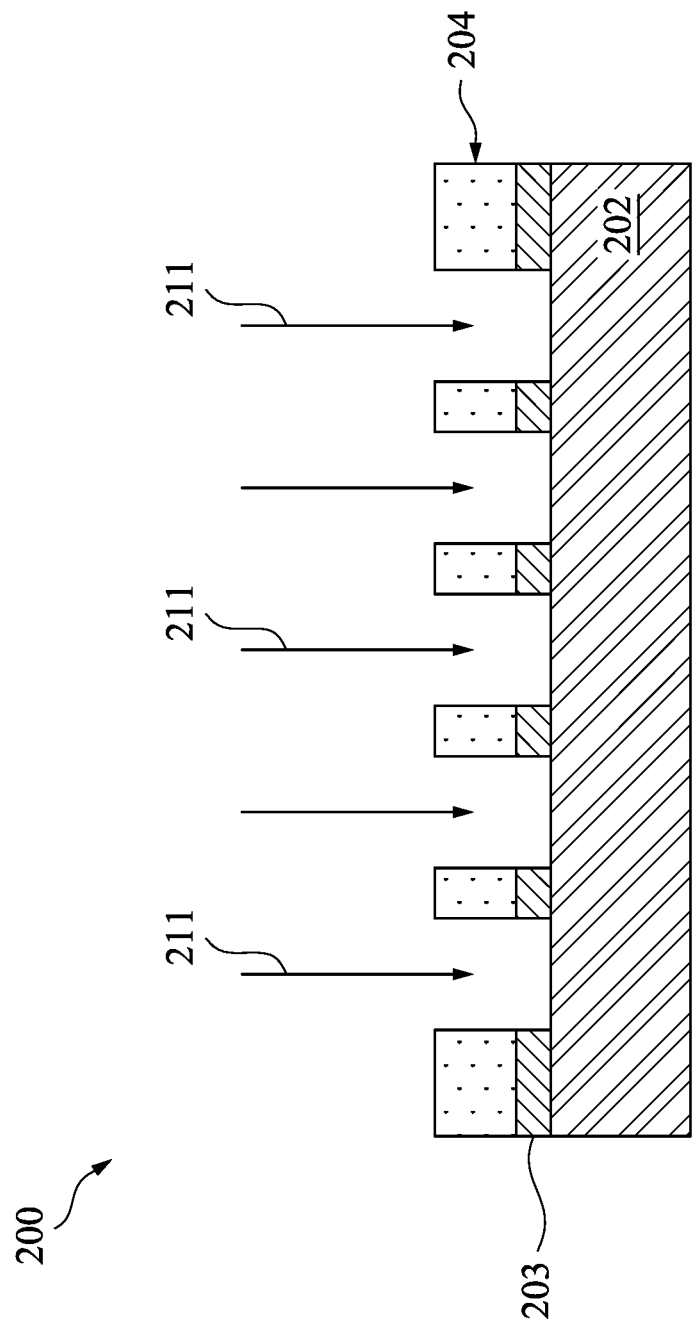

Referring to block 112 of FIG. 1A and to FIG. 7, the substrate 202 including metal layer 203 is processed using the patterned bottom layer 204 as a mask and an etchant 211. As noted above, if patterned photoresist layer 214 is not removed, etching of substrate 202, including metal layer 203, occurs through patterned photoresist layer 214 and patterned bottom layer 204. Metal layer 203 can include metals such as TiAlC, TiAl, TaAlC, TaAl, tungsten, cobalt, ruthenium, iridium, molybdenum, copper, aluminum, or combinations thereof. In the exemplary embodiment illustrated in FIG. 7, a portion of the metal layer 203 has been removed by etching using the patterned bottom layer 204 as an etch mask. In some embodiments, the metal layer 203 is etched using any suitable wet etching chemical and process. For example, in some embodiments, the metal layer is wet etched using an acidic or alkaline solution. The wet etching solution may contain an oxidant or it may not contain an oxidant. Examples of such wet etching solutions include those known as SC-1, SC-2, hydrogen peroxide, hydrochloric acid, ammonia and the like. Embodiments of the present disclosure are not limited to wet etching metal layer 203, for example, metal layer 203 can be etched using a dry etching process, an RIE process or other suitable etching process or combinations thereof.

It is understood that the concepts of the present disclosure apply to any fabrication process performed on the substrate 202. In various examples, the processed substrate 202 is used to fabricate a gate stack, to fabricate an interconnect structure, to form non-planar devices by etching to expose a fin or by epitaxially growing fin material, and/or other suitable applications. The bottom layer 204 is subsequently removed using any suitable method after the substrate 202 is processed.

The workpiece 200 may then be provided for additional fabrication processes. For example, the workpiece 200 may be used to fabricate an integrated circuit chip, a system-on-a-chip (SOC), and/or a portion thereof, and thus the subsequent fabrication processes may form various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, other types of transistors, and/or other circuit elements.

In accordance with embodiments of the present disclosure, an increased cross-linking density in the upper section 204U of the bottom layer 204 as noted above, renders the upper section 204U of bottom layer 204 less susceptible to penetration by the wet etchant used to remove portions of conductive layer 203 or substrate 202. Reducing or preventing penetration of the wet etchant into the bottom layer 204, i.e., into an upper surface of bottom layer 204 reduces or prevents bottom layer 204 from swelling due to absorption of the wet etchant. Reducing swelling of bottom layer 204 reduces stresses in the bottom layer and/or materials in contact with the bottom layer, which, as noted above, can result in delamination or deformation of the bottom layer and delamination or deformation of layers of material in contact with the bottom layer. In accordance with embodiments described herein, modifying the bottom layer in ways described herein serves to mitigate or remedy this unwanted swelling and the attendant adverse effects of such swelling, thus improving the quality of the bottom layer used during the lithography patterning process.

Figure 1B:

FIG. 1B is a flowchart of another embodiment of a method 118 in accordance with the present disclosure. The method 100 illustrated in FIG. 1A utilized a bilayer photoresist structure that included a bottom layer and a photoresist layer. The method 118 of FIG. 1B differs from the method 100 of FIG. 1A in that it utilizes a trilayer photoresist structure that includes a bottom layer, a hard mask and a photoresist layer. The description of steps 102, 104 and 112 with regard to FIG. 1A applies to steps 120, 122 and 134 as pointed out below.

Referring to block 120 of FIG. 1B and FIG. 2, a workpiece 200 including a substrate 202 is provided for patterning. The description above regarding FIG. 1A and step 102 providing a substrate is also applicable to step 120 and is not repeated here.

Referring to step 122 of FIG. 1B and FIG. 2, a bottom layer 204 (also referred to as an underlayer) is formed on substrate 202, e.g., over the substrate 202 or over the conductive layer 203 if one is present. The description above regarding FIG. 1A and step 104 of forming an organic underlayer over the substrate is also applicable to step 122 of FIGS. 1B and 1s not repeated here.

Figure 8:
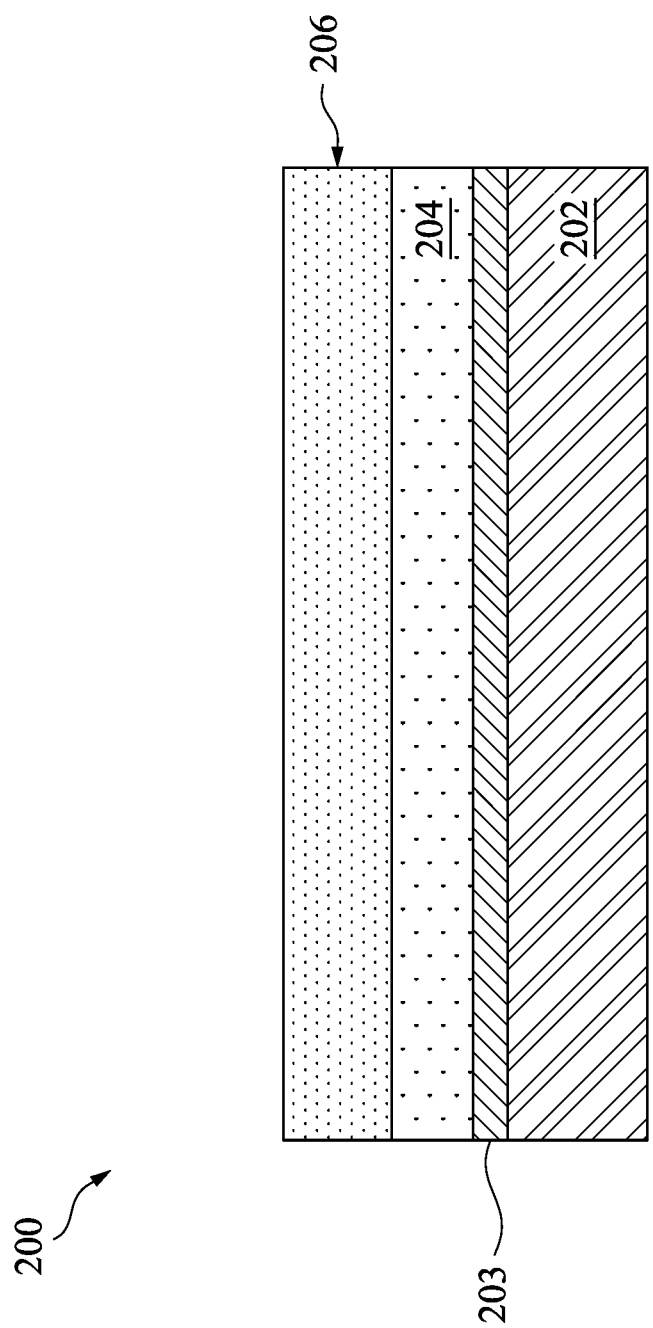
FIGS. 8-14 are views of various embodiments of an IC device at various stages of fabrication according to various aspects of the present disclosure.

Referring to step 124 of FIG. 1B and FIG. 8, a hard mask layer 206 is formed over the bottom layer 204. The hard mask layer 206 may be a single-layer structure or may include a number of layers, each of which may include a dielectric, a metal, a metal compound, and/or other suitable material. In many embodiments, the hard mask layer 206 comprises a dielectric material such as a semiconductor oxide, a semiconductor nitride, a semiconductor oxynitride, and/or a semiconductor carbide material. In an exemplary embodiment, the hard mask layer 206 comprises silicon carbide, silicon nitride, silicon oxycarbide, silicon oxynitride, or other suitable dielectric materials. The composition of the hard mask layer 206 is chosen such that the hard mask layer 206 can be selectively etched without substantially etching the bottom layer 204. In other words, the hard mask layer 206 and the bottom layer 204 comprise materials having distinct etching sensitivities towards a given etchant. The hard mask layer 206 may be formed by any suitable process including chemical vapor deposition (CVD), low-pressure CVD (LPCVD), plasma-enhanced CVD (PECVD), physical vapor deposition (PVD), atomic layer deposition (ALD), spin-on coating, and/or other suitable techniques, and may be formed to any suitable thickness.

Figure 9:
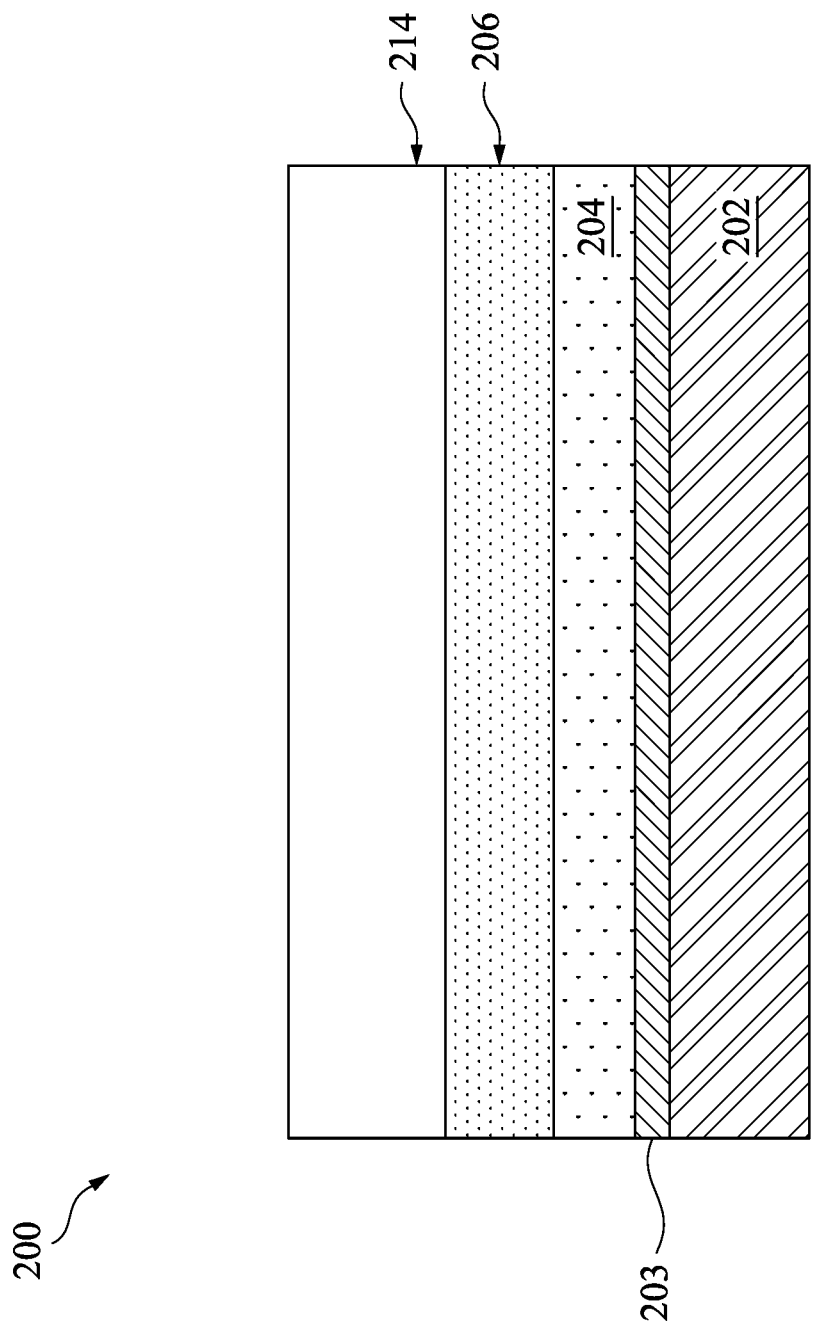
Figure 10:
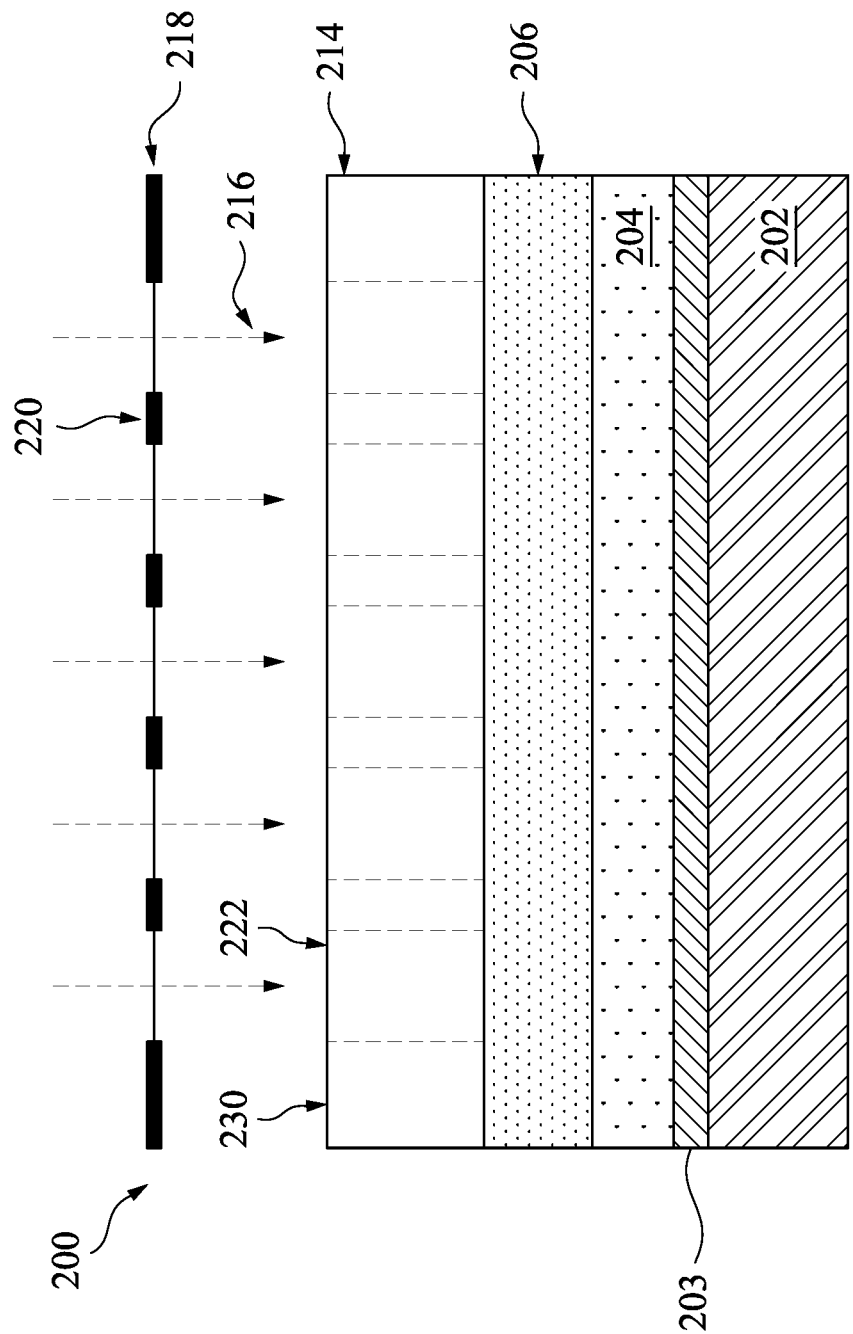

Referring to block 126 in FIG. 1B and to FIG. 9, a photoresist layer 214 is formed over hard mask layer 206. The photoresist layer 214 may include any lithographically sensitive resist material, and in many embodiments, the photoresist layer 214 includes a photoresist material sensitive to a radiation source (e.g., UV light, deep ultraviolet (DUV) radiation, and/or EUV radiation as depicted in FIG. 10). However, the principles of the present disclosure apply equally to e-beam resists and other direct-write resist materials. The photoresist layer 214 may be a positive-tone or negative-tone resist material and may have a multi-layer structure. Furthermore, the photoresist layer 214 may be implemented with a chemical amplification (CA) resist material. In one embodiment, a positive-tone CA resist material includes a polymeric material (not depicted) that becomes soluble in a developer after the polymer is exposed to acidic moieties. Alternatively, a negative-tone CA resist material includes a polymeric material (not depicted) that becomes insoluble in a developer after the polymer is exposed to acidic moieties.

The photoresist layer 214 may be applied by any suitable technique, and in an exemplary embodiment, the photoresist layer 214 is applied in a liquid form using a spin-on (i.e., spin coating) technique. A spin coating process may use centrifugal force to disperse the photoresist layer 214 in a liquid form across a surface of an underlying layer in a uniform thickness. To facilitate application, the photoresist layer 214 may include a solvent, which, when removed, leaves the photoresist layer 214 in a solid or semisolid form (e.g., a film). The solvent may be one or more of the following: propylene glycol methyl ether acetate, propylene glycol monomethyl ether, gamma-butyrolactone, ethyl lactate, cyclohexanone, n-butyl actetate, ethyl ketone, dimethyl formamide, alcohol (e.g., isopropyl alcohol or ethanol), or other suitable solvent. The solvent may be driven off as part of the spin coating, during a settling process, and/or during a post-application/pre-exposure baking process. The pre-exposure baking process may be implemented by any suitable equipment such as, for example, a hotplate, at any temperature suitable for the particular compositions of the photoresist layer 214 and the solvent employed.

Referring to block 128 of FIG. 1B and to FIG. 10, the photoresist layer 214 is exposed to a radiation source. In many embodiments, the radiation source having a wavelength 216 of approximately 365 nm, a DUV radiation such as KrF excimer laser (wavelength approximately 248 nm) or ArF excimer laser (wavelength approximately 193 nm), a EUV radiation (wavelength between about 1 nm and about 100 nm), an x-ray, an e-beam, an ion beam, and/or other suitable radiations. The exposure process at block 128 may be performed in air, in a liquid (immersion lithography), or in a vacuum (e.g., for EUV lithography and e-beam lithography). In an exemplary embodiment, the exposure process at block 128 implements a photolithography technique using a photomask 220 that includes a pattern 218. The photomask 220 may be a transmissive mask or a reflective mask, the latter of which may further implement resolution enhancement techniques such as phase-shifting, off-axis illumination (OAI) and/or optical proximity correction (OPC). In alternative embodiments, the radiation source having the wavelength 216 is directly modulated with a predefined pattern, such as an IC layout, without using a photomask 220 (such as using a digital pattern generator or direct-write mode). In an exemplary embodiment, the radiation source having the wavelength 216 is a EUV radiation and the exposure process at block 128 is performed in a EUV lithography system. Correspondingly, a reflective photomask may be used to pattern the photoresist layer 214.

Figure 11:
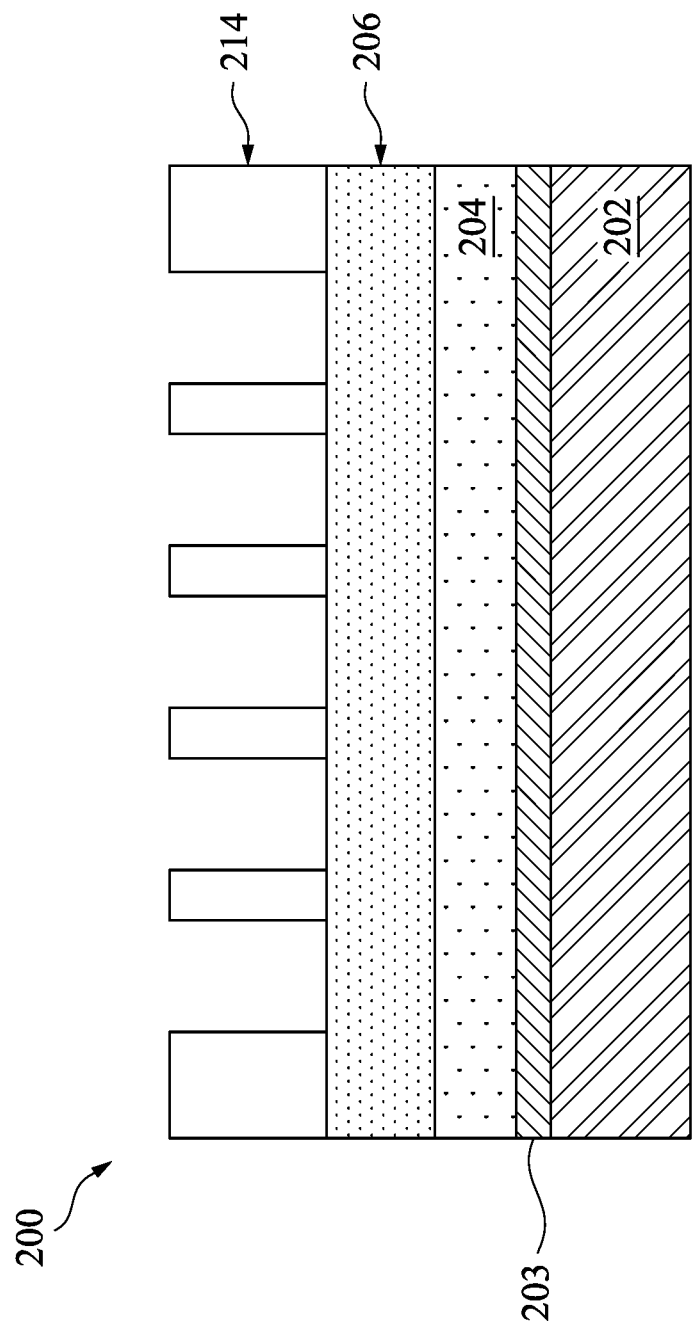

Continuing to refer block 128 of FIG. 1B and to FIG. 11, a developing process is performed on the workpiece 200. The developing process dissolves or otherwise removes either the exposed regions 222 in the case of a positive-tone resist development process or the unexposed regions 230 in the case of a negative-tone resist development process. The developing process at block 128 may begin with a post-exposure baking process. Following the optional post-exposure baking process, a developer is applied to the workpiece 200, thereby removing the particular regions (the exposed regions 222 or the unexposed regions 230) of the photoresist layer 214. Suitable positive-tone developers include tetramethyl ammonium hydroxide (TMAH), KOH, NaOH, and/or other suitable solvents, and suitable negative-tone developers include solvents such as n-butyl acetate, ethanol, hexane, benzene, toluene, and/or other suitable solvents. In some embodiments, a post-exposure bake is performed on the workpiece 200 subsequent to the developing process at block 128 to further stabilize the pattern of the photoresist layer 214. The resulting structure after step 128 with the patterned photoresist layer 214 is illustrated in FIG. 11.

Figure 12:
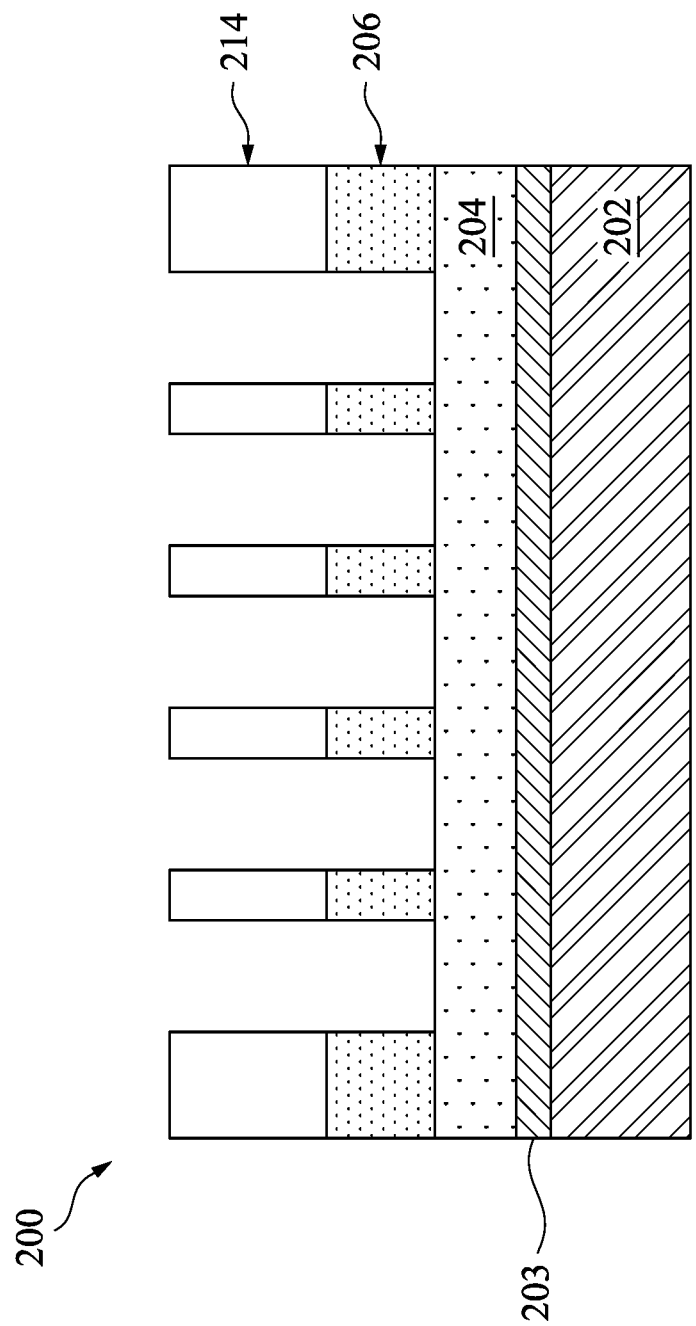

Referring to block 130 of FIG. 1B and to FIG. 12, the photoresist layer 214 may be used as an etch mask to selectively remove portions of the hard mask layer 206. In the depicted embodiment, the etching process at block 130 includes etching the hard mask layer 206. The pattern 218 formed in the photoresist layer 214 allows exposed portions of the hard mask layer 206 to be selectively etched. As such, the etching process at block 130 substantially removes portions of the hard mask layer 206, thereby demonstrating etching selectivity for the hard mask layer 206 over the bottom layer 204. The structure resulting from this etching of hard mask layer 206 is illustrated in FIG. 12. In an embodiment, the patterned photoresist layer 214 is removed from the workpiece 200 by any suitable method prior to removing portions of the bottom layer 204. In other embodiments, the patterned photoresist layer 214 is not removed from the workpiece prior to removing portions of the bottom layer 204.

Figure 13:
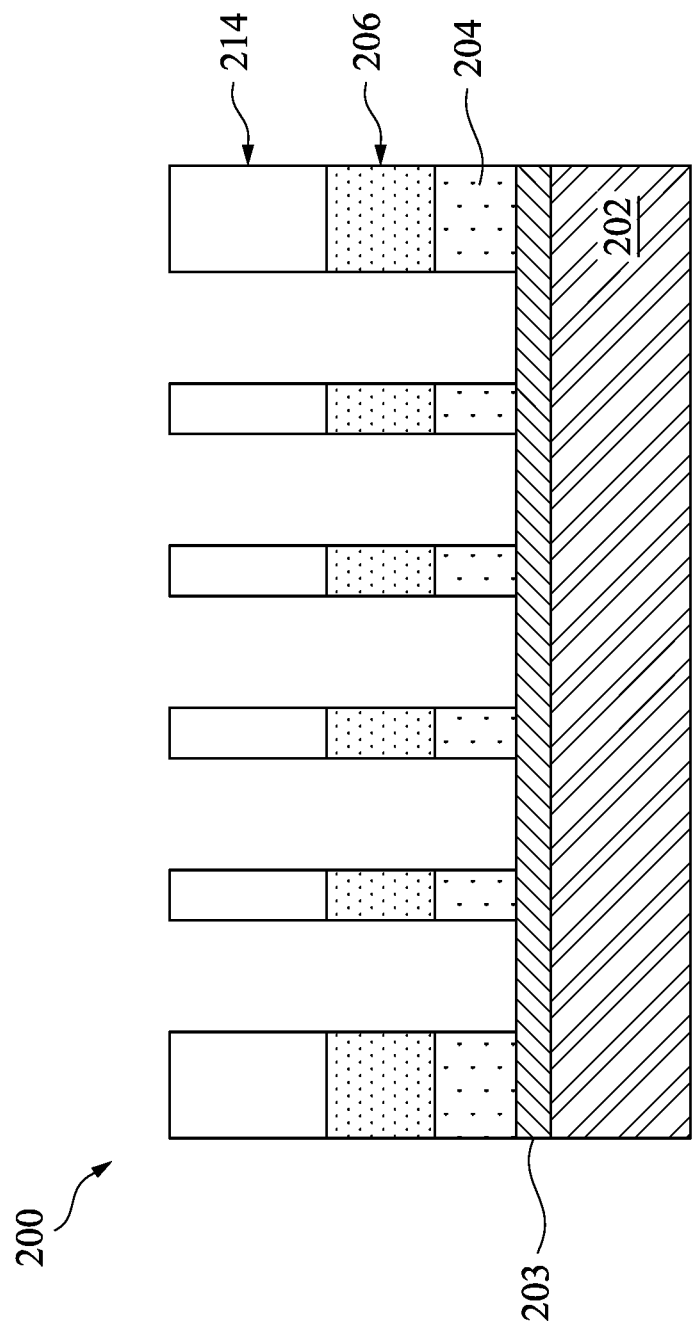

As depicted in block 132 in FIG. 1B and FIG. 13, the patterned photoresist layer 214 and the patterned hard mask layer 206 are together used as an etch mask to selectively remove portions of the bottom layer 204 in the etching process at block 132. The structure resulting from the removal of portions of bottom layer 204 in step 132 is illustrated in FIG. 13. In some embodiments, the photoresist layer 214 is removed using any suitable method prior to removing portions of metal layer 203 in step 134. In other embodiments, the patterned photoresist layer 214 is not removed prior to removing portions of metal layer 203 in step 134.

Figure 14:
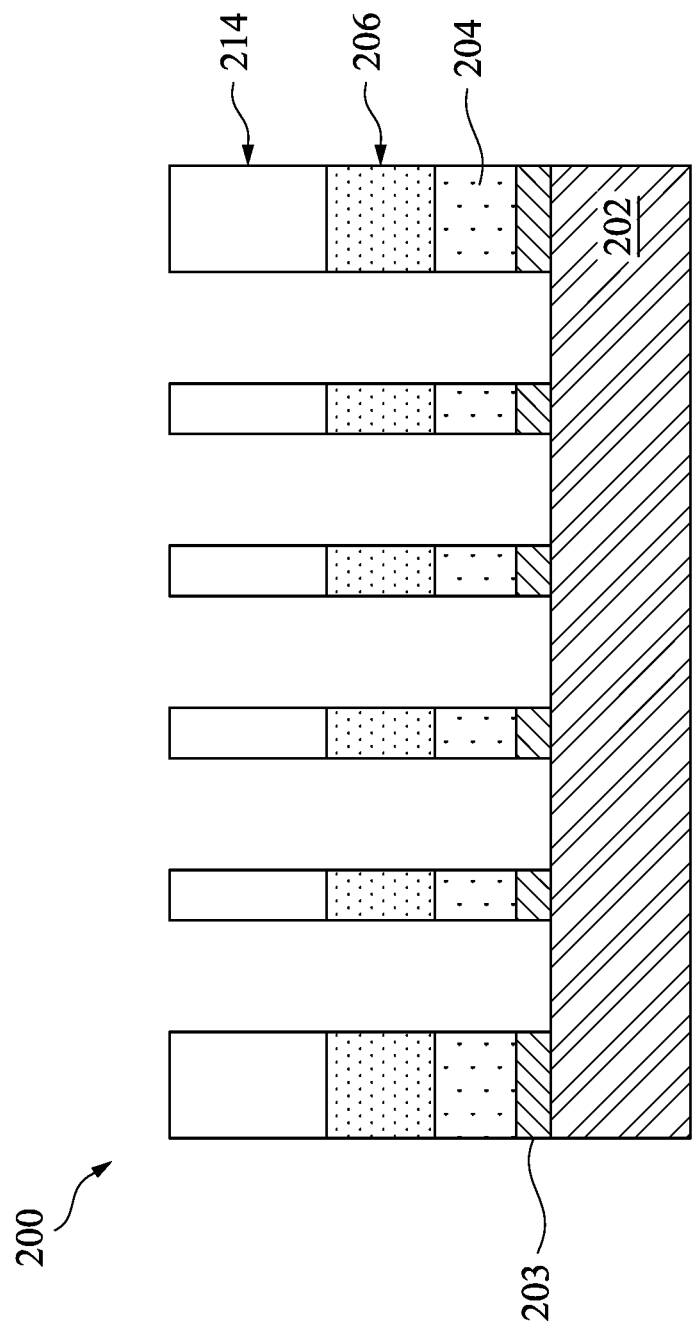

Referring to step 134 in FIG. 1B and FIG. 14, the metal layer 203 is etched using any suitable wet etching chemical and process. For example, in some embodiments, the metal layer is wet etched using an acidic or alkaline solution. The wet etching solution may contain an oxidant or it may not contain an oxidant. Examples of such wet etching solutions include those known as SC-1, SC-2, hydrogen peroxide, hydrochloric acid, ammonia and the like. Embodiments of the present disclosure are not limited to wet etching metal layer 203 using such solutions, for example, metal layer 203 can be etched using a dry etching process, an RIE process or other suitable etching process or combinations thereof.

It is understood that the concepts of the present disclosure apply to any fabrication process performed on the substrate 202. In various examples, the processed substrate 202 is used to fabricate a gate stack, to fabricate an interconnect structure, to form non-planar devices by etching to expose a fin or by epitaxially growing fin material, and/or other suitable applications. The bottom layer 204 and hard mask layer 206 are subsequently removed using any suitable method after the substrate 202 is processed.

The workpiece 200 may then be provided for additional fabrication processes. For example, the workpiece 200 may be used to fabricate an integrated circuit chip, a system-on-a-chip (SOC), and/or a portion thereof, and thus the subsequent fabrication processes may form various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, other types of transistors, and/or other circuit elements.

In accordance with embodiments of the present disclosure, an increased cross-linking density in the upper section 204U of the bottom layer 204 as noted above, renders the upper section 204U of bottom layer 204 less susceptible to penetration by the wet etchant used to remove portions of conductive layer 203 or substrate 202. Reducing or preventing penetration of the wet etchant into the bottom layer 204, i.e., into an upper surface of bottom layer 204, reduces or prevents bottom layer 204 from swelling due to absorption of the wet etchant. Reducing swelling of bottom layer 204 reduces stresses in the bottom layer and/or materials in contact with the bottom layer, which as noted above, can result in delamination or deformation of the bottom layer and delamination or deformation of layers of material in contact with the bottom layer. In accordance with embodiments described herein, modifying the bottom layer in ways described herein serves to mitigate or remedy this unwanted swelling and the attendant adverse effects of such swelling, thus improving the quality of the bottom layer used during the lithography patterning process.

In accordance with at least one embodiment, a method provides a substrate. The substrate may include a conductive feature. A bottom layer, e.g., a BARC layer, is provided over the substrate. The bottom layer includes a polymer, a first cross-linking agent and a second cross-linking agent different from the first cross-linking agent. The second cross-linking agent includes one or more functional groups including fluorine. The provided bottom layer is thermally treated to cross-link the polymer with the first and/or second cross-linking agent. A hard mask is formed over the thermally treated bottom layer prior to forming a photoresist layer over the hard mask layer. The photoresist layer is exposed to a radiation source to form a pattern in the photoresist layer. The photoresist layer is then developed and a first etching process is carried out to form the pattern in the bottom layer and the hard mask layer but not in the substrate. A second etching step is carried out to form the pattern in the substrate.

In accordance with at least one embodiment, a method includes providing a substrate including a conductive layer. A bottom layer, e.g., a BARC layer, is formed over the substrate. The bottom layer includes a plurality of polymers, a plurality of first cross-linking agents and a plurality of second cross-linking agents different from the first cross-linking agents. The forming of the bottom layer includes concentrating the second cross-linking agents near a surface of the bottom layer. The method includes cross-linking the polymers of the bottom layer using the plurality of first cross-linking agents and the second cross-linking agents. A photoresist is formed over the cross-linked bottom layer prior to exposing the photoresist layer to a radiation source according to a pattern. The patterned photoresist layer is then developed. A first etching processes carried out to form the pattern in the bottom layer but not in the conductive layer. A second etching step is carried out to form the pattern in the conductive layer.

In accordance with at least one embodiment, a method includes providing a substrate including a gate material layer. A bottom antireflective coating layer is formed over the gate material layer. The bottom antireflective coating layer includes one or more polymers selected from polyhydroxystyrene polymers, novolac polymers and polyhydroxystyrene and novolac copolymers. The bottom antireflective coating layer also includes a plurality of first cross-linking agents and a plurality of second cross-linking agents different from the first cross-linking agents. The second cross-linking agents include acrylate polymers, novolac polymers, polyhydroxystyrene polymers, polyhydroxystyrene and novolac copolymers that include at least one fluorine containing monomer unit. The method includes concentrating the second cross-linking agents near a surface of the bottom antireflective coating layer. The polymers of the bottom antireflective coating layer are cross-linked using the plurality of first cross-linking agents and the plurality of second cross-linking agents. A photoresist layer is formed over the cross-linked bottom layer prior to exposing the photoresist layer to a radiation source according to a pattern. The patterned photoresist layer is then developed. A first etching process is performed to form the pattern in the bottom layer but not in the gate material layer. A second etching step is carried out to form the pattern in the gate material layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a substrate;
   forming a bottom layer over the substrate, wherein the bottom layer includes a polymer, a first cross-linking agent and a second cross-linking agent different from the first cross-linking agent, the second cross-linking agent including one or more functional groups including fluorine;
   thermally treating the bottom layer;
   forming a hard mask layer over the thermally treated bottom layer;
   forming a photoresist layer over the hard mask layer;
   exposing the photoresist layer to a radiation source according to a pattern;
   developing the photoresist layer;
   performing a first etching process to form the pattern in the bottom layer and the hard mask layer but not in the substrate; and performing a second etching process to form the pattern in the substrate.

2. The method of claim 1, wherein forming the bottom layer includes forming a layer of a BARC material.

3. The method of claim 1 wherein providing a substrate includes providing a substrate that is conductive.

4. The method of claim 1, wherein the second cross-linking agent comprises a fluorine containing group satisfying one of the following formulas:

—$(CH_xF_y)_nCH_zF_m$ where n is 1 to 10, x+y=2 and z+m=3; and

—$(O—C_nF_{2n+1})$ where n=1 to 10.

5. The method of claim 4, wherein the bottom layer includes at least one polymer selected from an acrylate polymer, a novolac polymer and a hydroxystyrene polymer.

6. The method of claim 1, wherein the forming the bottom layer includes concentrating the second cross-linking agent near an interface between the bottom layer and the hard mask layer.

7. A method comprising:
providing a substrate including a conductive layer;
forming a bottom layer over the substrate, wherein the bottom layer includes a plurality of polymers, a plurality of first cross-linking agents and a plurality of second cross-linking agents different from the first cross-linking agents, the forming the bottom layer including concentrating the second cross-linking agents near a surface of the bottom layer;
cross-linking the polymers of the bottom layer using the plurality of first cross-linking agents and the plurality of second cross-linking agents;
forming a photoresist layer over the bottom layer;
exposing the photoresist layer to a radiation source according to a pattern;
developing the photoresist layer;
performing a first etching process to form the pattern in the bottom layer but not in the conductive layer; and
performing a second etching process to form the pattern in the conductive layer.

8. The method of claim 7, further comprising at least one of causing the polymers of the bottom layer to crosslink directly with each other, causing the first cross-linking agents to crosslink directly with each other and causing the second cross-linking agents to crosslink directly with each other.

9. The method of claim 8 wherein the at least one of causing the polymers of the bottom layer to crosslink directly with each other, causing the first cross-linking agents to crosslink directly with each other and causing the second cross-linking agents to crosslink directly with each other includes exposing the bottom layer to a light energy prior to the forming of the photoresist layer.

10. The method of claim 9, wherein the light energy has a wavelength between 10 nanometers and 1000 nanometers.

11. The method of claim 8, wherein the at least one of causing the polymers of the bottom layer to crosslink directly with each other, causing the first cross-linking agents to crosslink directly with each other and causing the second cross-linking agents to crosslink directly with each other includes exposing the bottom layer to a light energy after developing the photoresist layer.

12. The method of claim 7, further comprising forming a hard mask layer over the bottom layer prior to the forming a photoresist layer over the bottom layer.

13. The method of claim 7, wherein the cross-linking the polymers of the bottom layer using the plurality of first cross-linking agents and the plurality of second cross-linking agents includes adjusting a temperature of the bottom layer to between 150° C. to 300° C.

14. The method of claim 13, wherein the adjusting the temperature of the bottom layer to between 150° C. to 300° C. occurs in a single heating step or occurs in multiple heating steps.

15. The method of claim 7, wherein the conductive layer is metal gate material.

16. The method of claim 7, wherein the bottom layer is a bottom antireflective coating.

17. A method comprising:
providing a substrate including a gate material layer;
forming a bottom antireflective coating layer over the gate material layer, wherein the bottom antireflective coating layer includes one or more polymers selected from polyhydroxystyrene polymers, novolac polymers and polyhydroxystyrene and novolac copolymers, a plurality of first cross-linking agents and a plurality of second cross-linking agents different from the first cross-linking agents, the second cross-linking agents selected from acrylate polymers, novolac polymers, polyhydroxystyrene polymers, polyhydroxystyrene and novolac copolymers that include at least one fluorine containing monomer unit;
concentrating the second cross-linking agents near a surface of the bottom antireflective coating layer;
cross-linking the polymers of the bottom antireflective coating layer using the plurality of first cross-linking agents and the plurality of second cross-linking agents;
forming a photoresist layer over the bottom antireflective coating layer;
exposing the photoresist layer to a radiation source according to a pattern;
developing the photoresist layer;
performing a first etching process to form the pattern in the bottom antireflective coating layer but not in the gate material layer; and
performing a second etching process to form the pattern in the gate material layer.

18. The method of claim 17, wherein a ratio of the at least one fluorine containing monomer unit to other monomer units of the second cross-linking agent ranges 10:1 to 1:10.

19. The method of claim 17, wherein a weight ratio of the one or more polymers of the bottom antireflective coating layer to a combination of the first cross-linking agents and the second cross-linking agents ranges between 4:1 and 1:4.

20. The method of claim 17, wherein the plurality of second cross-linking agents includes a combination of thermal cross-linking agents and photosensitive cross-linking agents, a weight ratio of thermal cross-linking agents to photosensitive cross-linking agents ranging between 9:1 to 2:1.

* * * * *